(12) United States Patent
Nojima

(10) Patent No.: US 8,421,146 B2
(45) Date of Patent: Apr. 16, 2013

(54) SEMICONDUCTOR DEVICE HAVING VERTICAL TRANSISTOR, MANUFACTURING METHOD THEREOF, AND DATA PROCESSING SYSTEM

(75) Inventor: Kazuhiro Nojima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/443,331

(22) Filed: Apr. 10, 2012

(65) Prior Publication Data

US 2012/0193704 A1 Aug. 2, 2012

Related U.S. Application Data

(63) Continuation of application No. 12/832,736, filed on Jul. 8, 2010, now Pat. No. 8,174,068.

(30) Foreign Application Priority Data

Jul. 14, 2009 (JP) ................................. 2009-166017

(51) Int. Cl.
*H01L 29/78* (2006.01)
*H01L 29/00* (2006.01)

(52) U.S. Cl.
USPC ........... 257/329; 257/302; 257/314; 257/328; 257/330; 257/336; 257/E21.218; 257/E21.345; 257/E21.41; 257/E21.423; 257/E27.084; 438/149; 438/197; 438/239; 438/270

(58) Field of Classification Search ............ 257/302, 257/314, 328, 329, 330, 336, E21.218, E21.345, 257/E21.41, E21.423, E27.084; 438/149, 438/197, 239, 270

See application file for complete search history.

(56) References Cited

U.S. PATENT DOCUMENTS

| 6,566,187 | B1 | 5/2003 | Willer et al. |
| 2008/0296677 | A1* | 12/2008 | Takaishi ................. 257/336 |
| 2009/0085088 | A1* | 4/2009 | Takaishi ................. 257/314 |
| 2009/0148992 | A1* | 6/2009 | Oyu ....................... 438/268 |

FOREIGN PATENT DOCUMENTS

JP 2008-288391 11/2008

* cited by examiner

*Primary Examiner* — Dao H Nguyen
(74) *Attorney, Agent, or Firm* — McDermott Will & Emery LLP

(57) ABSTRACT

A semiconductor device includes: a semiconductor substrate; a silicon pillar provided perpendicularly to a main surface of the semiconductor substrate; a gate dielectric film that covers a portion of a side surface of the silicon pillar; an insulator pillar that covers remaining portions of the side surface of the silicon pillar; a gate electrode that covers the silicon pillar via the gate dielectric film and the insulator pillar; an interlayer dielectric film provided above the silicon pillar, the gate dielectric film, the insulator pillar, and the gate electrode; and a gate contact plug embedded in a contact hole provided in the interlayer dielectric film, and in contact with the gate electrode and the insulator pillar. A film thickness of the insulator pillar in a lateral direction is thicker than a film thickness of the gate dielectric film in a lateral direction.

5 Claims, 20 Drawing Sheets

SEMICONDUCTOR DEVICE HAVING VERTICAL TRANSISTOR, MANUFACTURING METHOD THEREOF, AND DATA PROCESSING SYSTEM

RELATED APPLICATIONS

This application is a Continuation of U.S. application Ser. No. 12/832,736, filed on Jul. 8, 2010, now U.S. Pat. No. 8,174,068 claiming priority of Japanese Patent Application No. 2009-166017, filed on Jul. 14, 2009, the entire contents of each of which are incorporated by reference.

BACKGROUND OF THE INVENTION

1. Field of the Invention

The present invention relates to a semiconductor device, a manufacturing method thereof, and a data processing system, and more particularly relates to a semiconductor device having a vertical transistor, a manufacturing method thereof, and a data processing system.

2. Description of Related Art

In semiconductors, particularly in memory devices, chip sizes are reduced year by year from a viewpoint of cost reduction. In response to this trend, employment of a vertical transistor having a $4F^2$ configuration has been progressed for cell transistor in DRAM (Dynamic Random Access Memory). As for transistors of peripheral circuits, because demand for downscaling is not so high as that of cell transistors, conventional planar transistors are still employed. However, when configurations of cell transistors and configurations of transistors for peripheral circuits are different, the number of processes greatly increases. Accordingly, employment of a vertical transistor having a $4F^2$ configuration has been studied recently for transistors of peripheral circuits.

In a vertical transistor incorporated in a peripheral circuit, two silicon pillars close to each other are used as described in Japanese Patent Application Laid-open No. 2008-288391. One of the two silicon pillars is used for a channel, an impurity diffusion layer is provided in each of an upper part and a lower part of this silicon pillar, and a side surface thereof is covered with a gate electrode via a gate dielectric film. The other silicon pillar is a dummy silicon pillar to extend the length of the gate electrode to a lateral direction, and a gate contact plug is provided by using an extended portion.

Formation of an impurity diffusion layer at an upper part (hereinafter, "upper diffusion layer") and a gate contact plug is briefly explained. First, a silicon pillar and a gate electrode are formed, and thereafter an interlayer dielectric film is deposited on the entire surface of a substrate while leaving a hardmask for formation of silicon pillars. The surface is planarized by CMP (Chemical Mechanical Polishing). Subsequently, an opening of the interlayer dielectric film is formed by a lithography method at a position above a silicon pillar for a channel, and only a hardmask positioned at an upper part of the silicon pillar for the channel is exposed. The exposed hardmask is removed by thermal phosphoric acid, and the upper diffusion layer is formed within the opening. Thereafter, an interlayer dielectric film is deposited, a contact hole is provided at a position near a boundary between a dummy silicon pillar and the gate electrode, and a conductor is embedded into the contact hole, thereby forming a gate contact plug. Insulation between the gate contact plug and the dummy silicon pillar is secured by a hardmask remaining at an upper part of the dummy silicon pillar.

When the chip size becomes smaller, the distance between two silicon pillars constituting one vertical transistor also needs to be narrower. In this case, positioning at the time of forming an opening in the interlayer dielectric film by using the lithography method becomes difficult. Consequently, the hardmask positioned at the upper part of the dummy silicon pillar is also removed, and there can be a case that the dummy silicon pillar and the gate contact plug are short-circuited.

SUMMARY

In one embodiment, there is provided a semiconductor device comprising: a semiconductor substrate having a main surface; a silicon pillar having first and second side surfaces that are substantially perpendicular to the main surface of the semiconductor substrate; a gate dielectric film that covers the first side surface of the silicon pillar; an insulator pillar that covers the second side surface of the silicon pillar; a gate electrode having a first portion that covers the first side surface of the silicon pillar via the gate dielectric film and a second portion that covers the insulator pillar; an interlayer dielectric film provided above the silicon pillar, the gate dielectric film, the insulator pillar, and the gate electrode; and a gate contact plug that is embedded in a first contact hole provided in the interlayer dielectric film and is in contact with the second portion of the gate electrode, wherein a film thickness of the insulator pillar in a direction parallel to the main surface of the semiconductor substrate is thicker than a film thickness of the gate dielectric film in the direction.

In another embodiment, there is provided a semiconductor device comprising: a semiconductor substrate having a main surface; a silicon pillar having a side surface that is substantially perpendicularly to the main surface of the semiconductor substrate; an insulation film that covers the side surface of the silicon pillar; a gate electrode that covers the side surface of the silicon pillar via the insulation film; an interlayer dielectric film provided above the silicon pillar, the insulation film, and the gate electrode; and a gate contact plug that is embedded in a contact hole provided in the interlayer dielectric film and in contact with the gate electrode, wherein a film thickness of a first portion of the insulation film intervening between the silicon pillar and a portion of the gate electrode in contact with the gate contact plug is thicker than a film thickness of a second portion of the insulation film intervening between the silicon pillar and another portion of the gate electrode not in contact with the gate contact plug.

In still another embodiment, there is provided a manufacturing method of a semiconductor device, comprising: forming a trench by etching a part of a main surface of a silicon substrate; filling the trench with an insulation film; etching the main surface of the silicon substrate and the insulation film by using a mask crossing a boundary between the silicon substrate and the insulation film to form a composite pillar made of a silicon pillar and an insulator pillar; forming a gate dielectric film on a side surface of the silicon pillar; forming a gate electrode by forming a film of a conductive material on the main surface of the silicon substrate, and by etching back the film formed; forming a first interlayer dielectric film that covers side surfaces of the composite pillar and the gate electrode; removing the mask to expose an upper surface of the composite pillar; forming a first diffusion layer by selectively epitaxially growing silicon within a through hole formed by removing the mask film; forming a second interlayer dielectric film that covers the first interlayer dielectric film and the composite pillar; forming first and second contact holes for exposing the gate electrode and the first diffusion layer, respectively on the second interlayer dielectric film; and forming first and second contact plugs in the first and second contact holes, respectively.

In still another embodiment, there is provided a data processing system comprising a semiconductor device, a data processor, a ROM, a storage device, and an I/O device, wherein the semiconductor device, the data processor, the ROM, the storage device, and the I/O device are connected to each other by a system bus, the semiconductor device comprising: a semiconductor substrate having a main surface; a silicon pillar having first and second side surfaces that are substantially perpendicular to the main surface of the semiconductor substrate; a gate dielectric film that covers the first side surface of the silicon pillar; an insulator pillar that covers the second side surface of the silicon pillar; a gate electrode having a first portion that covers the first side surface of the silicon pillar via the gate dielectric film and a second portion that covers the insulator pillar; an interlayer dielectric film provided above the silicon pillar, the gate dielectric film, the insulator pillar, and the gate electrode; and a gate contact plug that is embedded in a first contact hole provided in the interlayer dielectric film and is in contact with the second portion of the gate electrode, wherein a film thickness of the insulator pillar in a direction parallel to the main surface of the semiconductor substrate is thicker than a film thickness of the gate dielectric film in the direction.

According to the present invention, short-circuiting between the dummy silicon pillar and the gate contact plug can be prevented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will be explained below in detail with reference to the accompanying drawings.

Figure 1A:
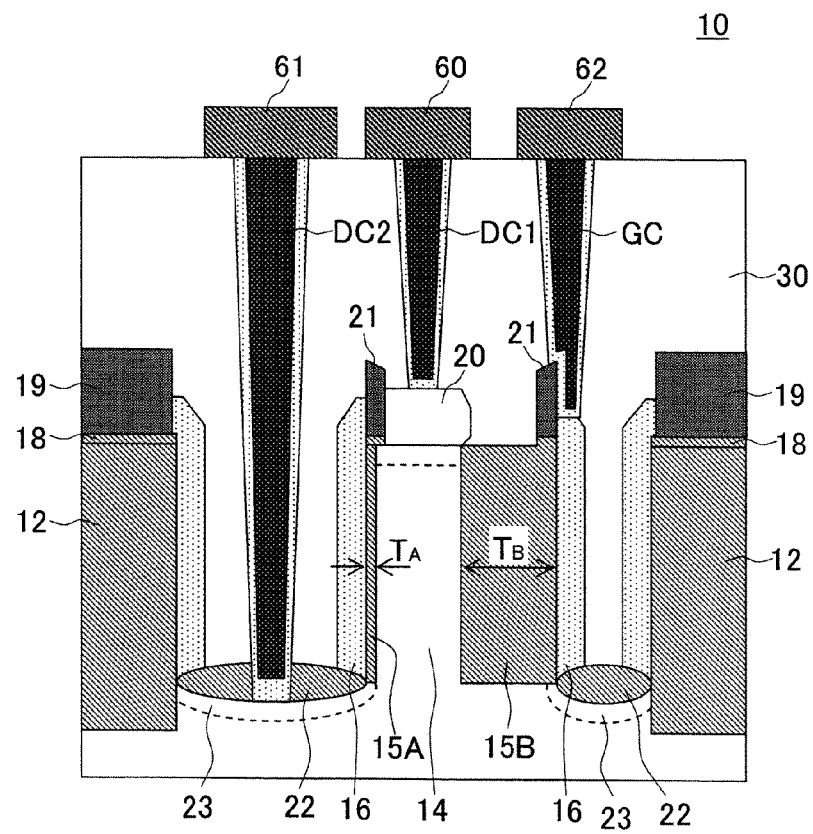
FIG. 1A is a schematic cross-sectional view showing a configuration of a semiconductor device according to an embodiment of the present invention along a line A-A' in FIG. 1B.
Figure 1B:
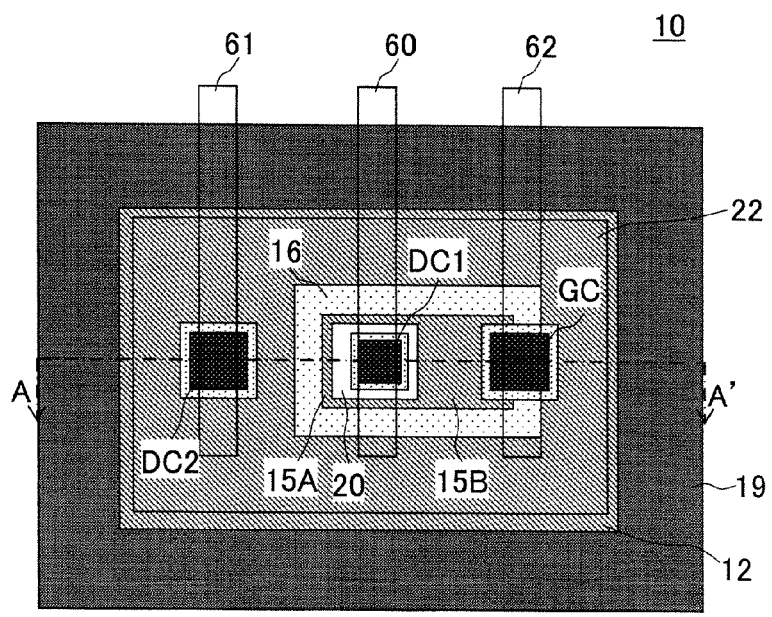
FIG. 1B is a schematic plan view showing a configuration of the semiconductor device according to an embodiment of the present invention.

FIGS. 1A and 1B show a configuration of a semiconductor device 10 according to an embodiment of the present invention; where FIG. 1A is a schematic cross-sectional view and FIG. 1B is a schematic plan view. FIG. 1A is a cross-sectional view along a line A-A' in FIG. 1B.

As shown in FIGS. 1A and 1B, the semiconductor device 10 includes an STI (Shallow Trench Isolation) 12 formed on a main surface of a silicon substrate 11, and a silicon pillar 14 formed within a region (an active region) surrounded by the STI 12.

The silicon pillar 14 is a quadratic prism. Out of four side surfaces of this quadratic prism, three side surfaces excluding a side surface at a right side of these drawings are covered with a gate dielectric film 15A, and the side surface at the right side of the drawings is covered with a dummy pillar (an insulator pillar) 15B. The gate dielectric film 15A is a thermal oxide film formed by thermally oxidizing a side surface of the silicon pillar 14. On the other hand, the dummy pillar 15B is a vapor-phase-grown film formed by depositing a silicon oxide film by a CVD (Chemical Vapor Deposition) method at an adjacent position of the silicon pillar 14. A film thickness $T_B$ of the dummy pillar 15B in a lateral direction is thicker than a film thickness $T_A$ of the gate dielectric film 15A in a lateral direction.

A gate electrode 16 made of a polycrystalline silicon film is formed to surround outer circumferences of the gate dielectric film 15A and the dummy pillar 15B. The gate electrode 16 faces the side surface of the silicon pillar 14 by sandwiching the gate dielectric film 15A and the dummy pillar 15B.

On an upper part of the STI 12, a substrate protection film (a silicon oxide film) 18 and a cap insulation film (a silicon nitride film) 19 used for the mask at the time of forming the silicon pillar 14 and the dummy pillar 15B remain without being removed. On upper parts of the silicon pillar 14 and the dummy pillar 15B, the substrate protection film 18 and the cap insulation film 19 are removed, and a first diffusion layer 20 is formed instead. A silicon film that becomes a base of the first diffusion layer 20 is formed on the silicon pillar 14 by a selective epitaxial growth. Therefore, the first diffusion layer 20 is formed only on the silicon pillar 14, and is not formed on the dummy pillar 15B.

A second diffusion layer 23 is formed at a lower part of the silicon pillar 14. The second diffusion layer 23 is not formed in a region immediately beneath the silicon pillar 14, but is formed in a flat region of the silicon substrate 11 where the silicon pillar 14 is not formed.

The semiconductor device 10 further includes an interlayer dielectric film 30 made of a silicon oxide film that covers the main surface of the silicon substrate 11. The film thickness of the interlayer dielectric film 30 is set to exceed heights of the first diffusion layer 20 and the cap insulation film 19 described above.

Three through-hole conductors DC1 (a first diffusion-layer contact plug), DC2 (a second diffusion-layer contact plug), and GC (a gate contact plug) are formed in the interlayer dielectric film 30. A lower part of the first diffusion-layer contact plug DC1 is in contact with an upper surface of the first diffusion layer 20. A lower part of the second diffusion-layer contact plug DC2 is in contact with the second diffusion layer 23. A lower part of the gate contact plug GC is in contact with an upper surface of the gate electrode 16. The gate contact plug GC is in contact with a part of a portion positioned at a peripheral boarder of the dummy pillar 15B (a portion at an opposite side of the first silicon pillar 14 sandwiching the dummy pillar 15B) of the upper surface of the gate electrode 16. Upper parts of the contact plugs DC1, DC2, and GC, respectively, are connected to wiring patterns 60 to 62 formed on the interlayer dielectric film 30.

In the semiconductor device 10 having the above configuration, the silicon pillar 14 becomes a channel of a transistor. The first diffusion layer 20 functions as one of a source and a drain, and the second diffusion layer 23 functions as the other of the source and the drain. A source, a drain, and a gate of a transistor are extracted to the wiring patterns 60 to 62 by the contact plugs DC1, DC2, and GC, respectively.

An ON/OFF control of a transistor is performed by an electric field given to the gate electrode 16 through the gate contact plug GC. A channel is formed within the silicon pillar 14 positioned between the first diffusion layer 20 and the second diffusion layer 23.

According to the configuration of the semiconductor device 10 explained above, a short-circuiting between the gate contact plug GC and the silicon pillar can be prevented. That is, because the dummy pillar 15B is configured by an insulation film, a short-circuiting between the gate contact plug GC and the silicon pillar does not occur even when the gate contact plug GC is in contact with the dummy pillar 15B.

Further, because the dummy pillar 15B is configured by an insulation film, a short-circuiting between the gate contact plug GC and the silicon pillar does not occur even when the cap insulation film 19 on the dummy pillar is removed. Consequently, in performing a lithography process of removing the cap insulation film 19 on the silicon pillar 14, fine positioning to leave the cap insulation film 19 on the dummy pillar is not necessary.

Because the dummy pillar 15B and the silicon pillar 14 stick fast each other, adjusting an interval between the dummy pillar 15B and the silicon pillar 14 is not necessary at the time of changing the film thickness of the gate electrode 16 in a lateral direction to decrease a stress. That is, when a gap is present between the dummy pillar 15B and the silicon pillar 14, the interval between the dummy pillar 15B and the silicon pillar 14 also needs to be adjusted when the film thickness of the gate electrode 16 in a lateral direction is to be changed to decrease a stress or the like. However, because an interval between the dummy pillar 15B and the silicon pillar 14 is basically zero in the semiconductor device 10, there is no room that the gate electrode 16 enters this interval. Consequently, even when the film thickness of the gate electrode 16 in a lateral direction is changed, the interval between the dummy pillar 15B and the silicon pillar 14 can be maintained at zero regardless of the change of the film thickness. That is, the film thickness of the gate electrode 16 in a lateral direction can be flexibly changed.

Because an interval between the dummy pillar 15B and the silicon pillar 14 is basically zero, a variation of the interval does not occur. Accordingly, a positioning deviation between the wiring patterns 60 to 62 and the contact plugs DC1, DC2, and GC can be prevented.

Because the dummy pillar 15B is configured by an insulation film, a floating capacitance between the gate electrode 16 and the semiconductor substrate 11 becomes small.

A manufacturing method of the semiconductor device 10 according to the present embodiment is explained in detail next.

FIG. 2 to FIG. 25 are process diagrams for explaining the manufacturing method of the semiconductor device 10 according to the present embodiment. FIG. 2, FIG. 3, FIG. 4A, FIG. 5, FIG. 6, FIG. 7A, and FIGS. 8 to 25 show a cross section of the semiconductor device 10 corresponding to the cross section along the line A-A' in FIG. 1B. FIG. 4B and FIG. 7B are schematic plan views of the semiconductor device 10.

Figure 2:
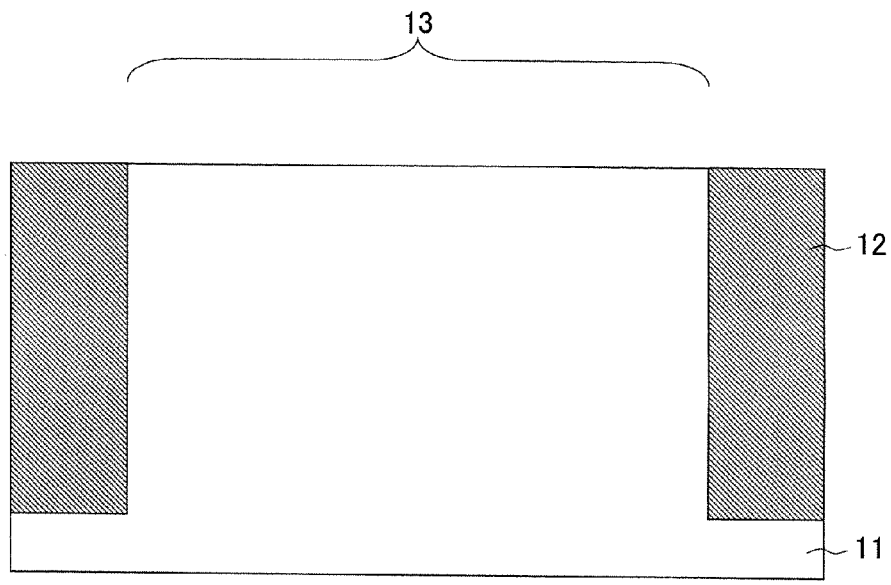
FIGS. 2, 3, 4A, 5, 6, 7A, and 8-25 are process diagrams for explaining the manufacturing method of the semiconductor device according to the embodiment of the present invention and shows a cross-sectional view corresponding to the cross-sectional view along the line A-A' in FIG. 1B.
Figure 3:
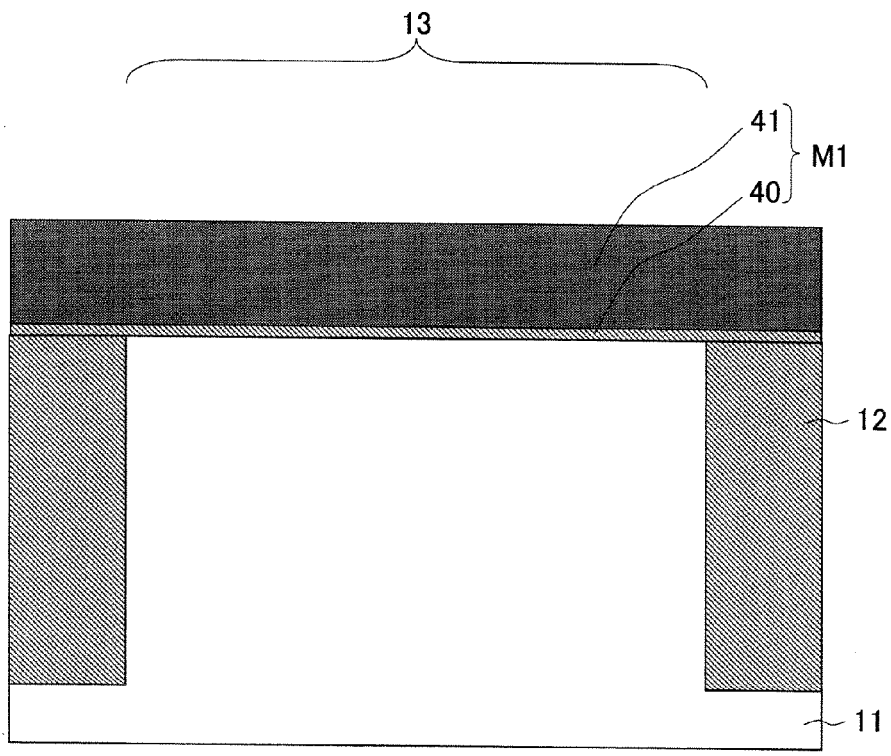

In the manufacturing of the semiconductor device 10, the silicon substrate 11 is prepared first. By forming the STI 12 on the silicon substrate 11, an active region 13 surrounded by the STI 12 is formed (FIG. 2). Although many active regions are formed on the silicon substrate 11 in practice, the drawings show only one active region. Although not particularly limited thereto, the active region 13 according to the present embodiment has a rectangular shape.

In forming the STI 12, a trench having a thickness of about 220 nm is formed by dry etching on the main surface of the silicon substrate 11. A silicon oxide film having a small thickness is formed by thermal oxidation at about 1000° C. on the entire surface of the substrate including an internal wall of the trench. Thereafter, a silicon oxide film having a thickness of 400 nm to 500 nm is deposited by the CVD method on the entire surface of the substrate including inside of the trench. Thereafter, a silicon oxide film not necessary on the silicon substrate 11 is removed by CMP, and the silicon oxide film is left in only inside of the trench, thereby forming the STI 12.

The silicon pillar 14 is then formed within the active region 13. In forming the silicon pillar 14, a substrate protection film 40 made of a silicon oxide film is formed on the entire surface of the silicon substrate 11. An insulation film 41 made of a silicon nitride film is formed on the substrate protection film 40 (FIG. 3). Although not particularly limited thereto, the substrate protection film 40 and the insulation film 41 can be formed by the CVD method, and preferably, the film thickness of the substrate protection film 40 is about 5 nm, and the film thickness of the insulation film 41 is about 120 nm. A laminated film of the substrate protection film 40 and the insulation film 41 is also called a hardmask M1 in the following explanations.

Figure 4A:
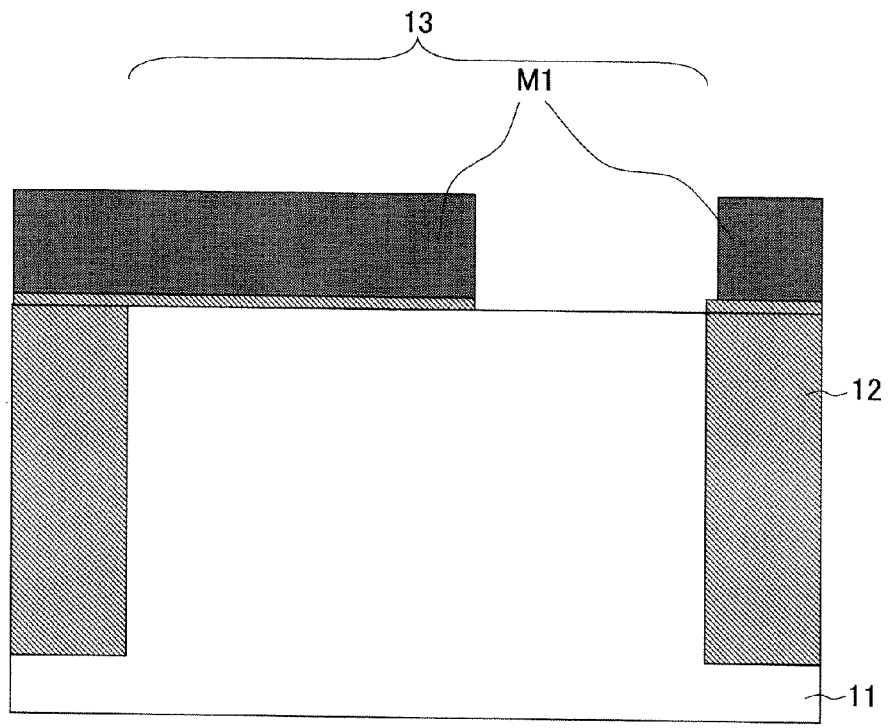
Figure 4B:
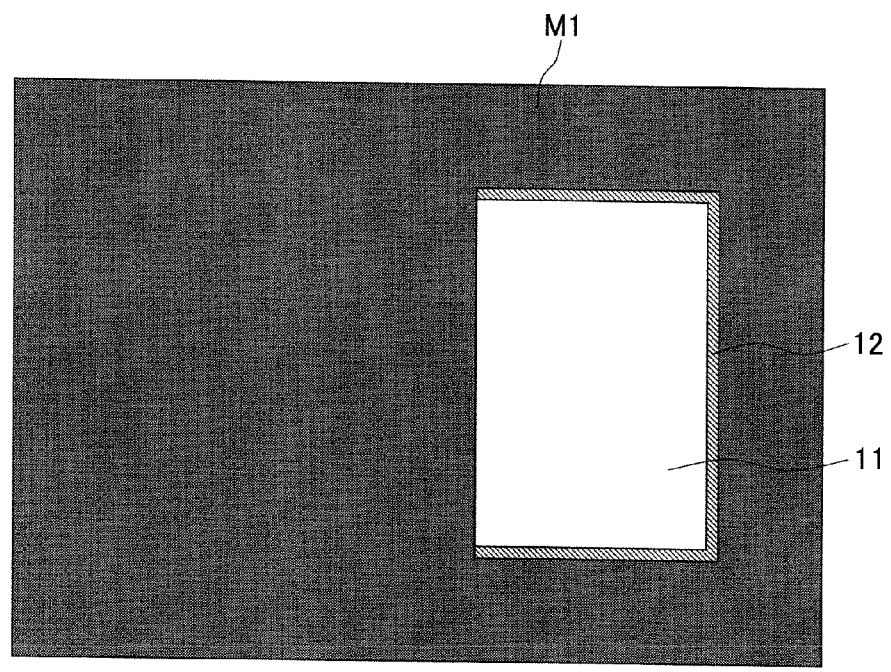
FIGS. 4B and 7B are process diagrams for explaining the manufacturing method of the semiconductor device according to the embodiment of the present invention and show a plan view of the semiconductor.

Thereafter, the hardmask M1 is patterned, thereby removing the hardmask M1 left in a part of a region in the active region 13 (FIGS. 4A and 4B). To avoid forming an unnecessary silicon pillar within the active region 13, an edge of the hardmask M1 that covers the STI 12 can be positioned at slightly outside of an outer circumference of the active region 13.

Figure 5:
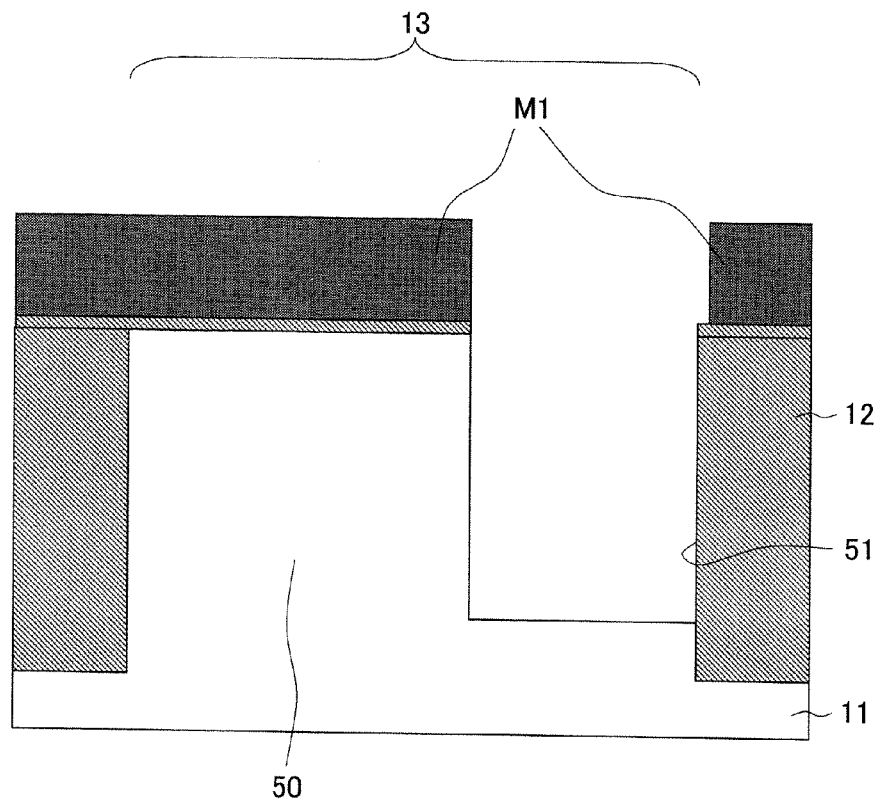
Figure 6:
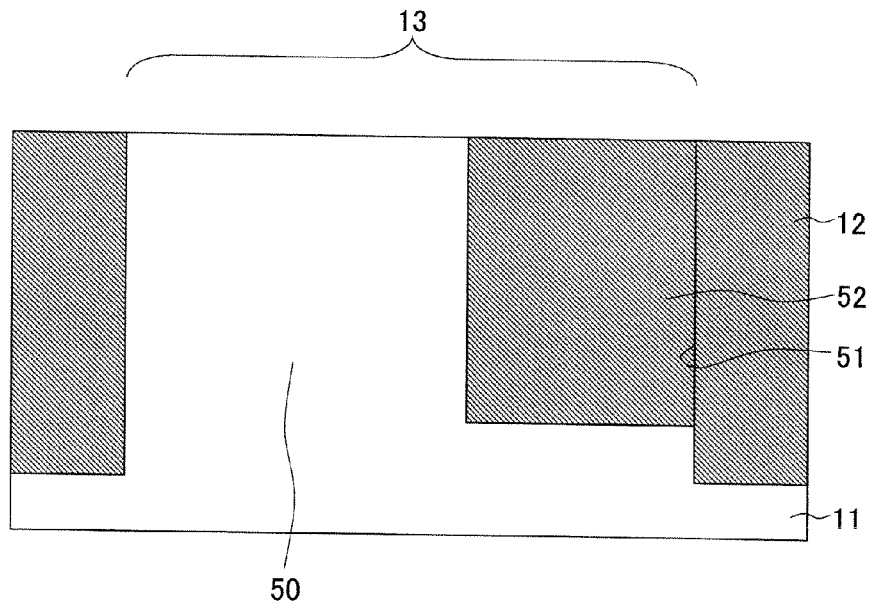

An exposed surface of the active region 13 is deepened by dry etching using the hardmask M1 which is patterned in this way (FIG. 5). By this etching process, a silicon pillar 50 and a trench 51 substantially perpendicular to the main surface of the silicon substrate 11 are formed.

A silicon oxide film having a thickness of 300 nm to 400 nm is then deposited by the CVD method on the entire surface of the substrate 11 including inside of the trench 51. Thereafter, the silicon oxide film deposited on the hardmask M1 is removed by using a silicon nitride film as a stopper, and the silicon oxide film is left only within the trench 51. The insulation film 41 is removed by wet etching, and the silicon oxide film is removed by CMP using silicon as a stopper. As a result, as shown in FIG. 6, an upper surface of the silicon pillar 50 and an upper surface of a silicon oxide film 52 formed within the trench 51 are set to be in the same plane.

The substrate protection film 18 made of a silicon oxide film is then formed on the entire surface, and the insulation film 19 made of a silicon nitride film is formed on the substrate protection film 18. Although not particularly limited thereto, the substrate protection film 18 and the insulation film 19 can be formed by the CVD method, and preferably, the film thickness of the substrate protection film 18 is about 5 nm, and the film thickness of the insulation film 19 is about 120 nm. A laminated film of the substrate protection film 18 and the insulation film 19 is also called a hardmask M2 in the following explanations.

Figure 7A:
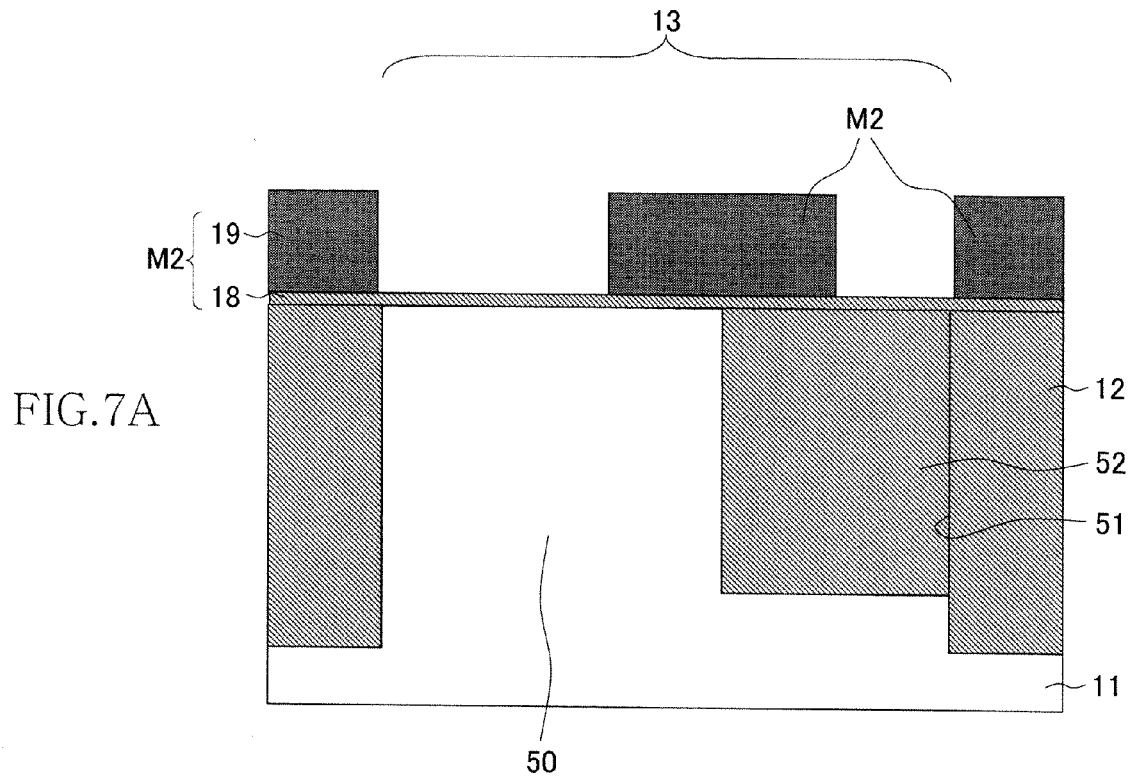
Figure 7B:
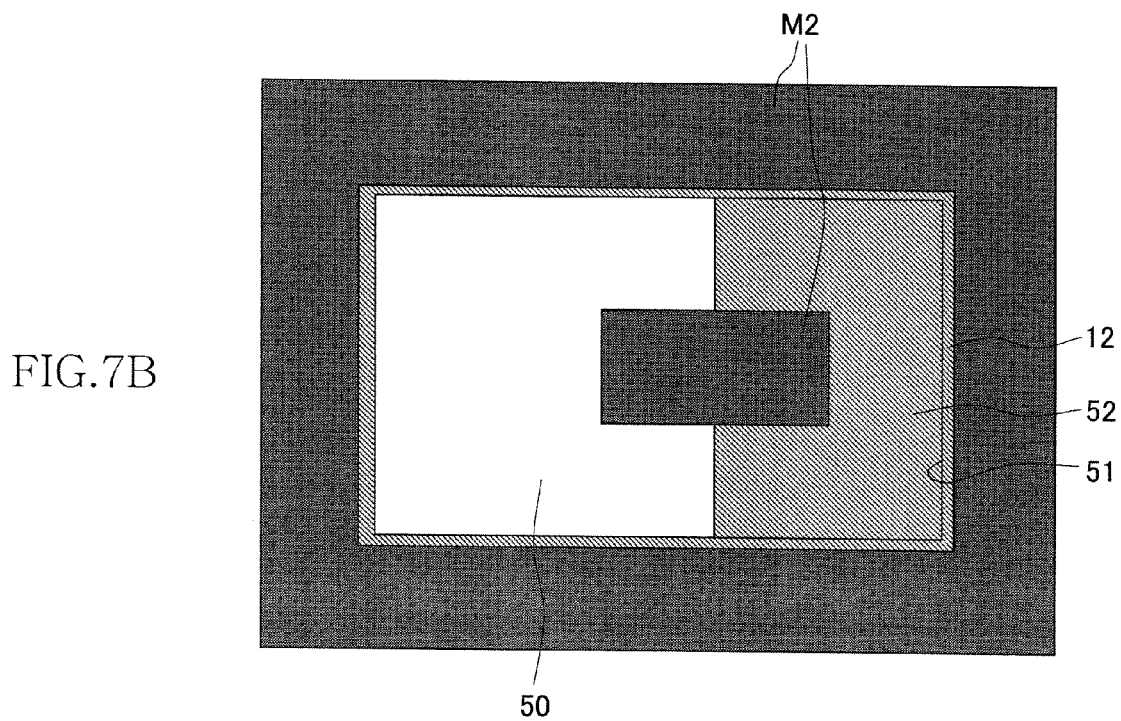

Thereafter, the insulation film 19 is patterned, thereby removing the insulation film 19 left in a part of a region in the active region 13 (FIGS. 7A and 7B). This patterning is performed such that the insulation film 19 remaining crosses a boundary between the silicon substrate 11 and the silicon oxide film 52. In this case, an edge of the insulation film 19 that covers the STI 12 can be also positioned at slightly outside of the outer circumference of the active region 13.

Figure 8:
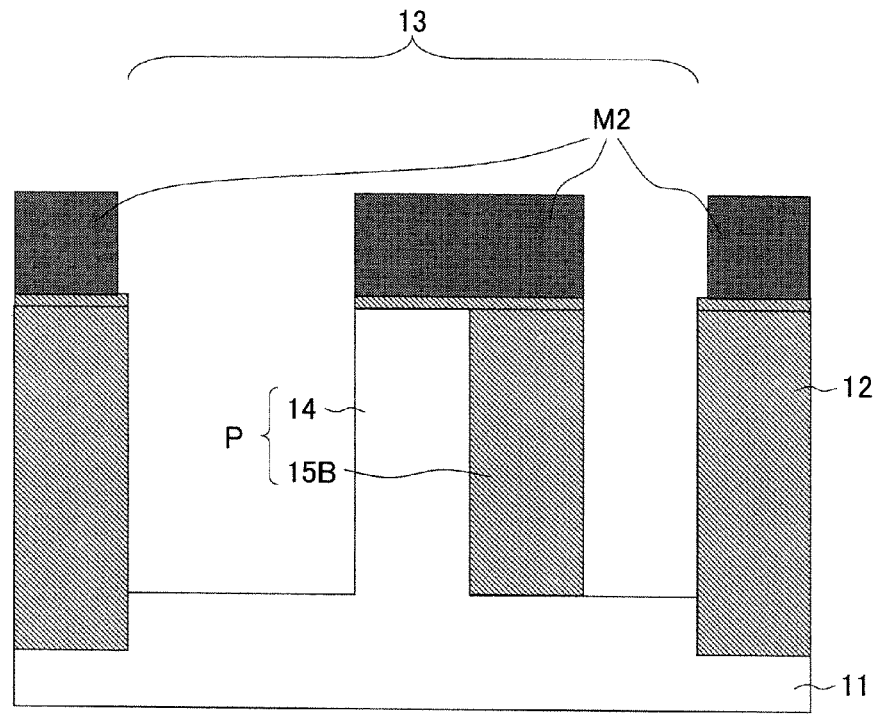

An exposed surface of the active region 13 (an exposed surface of the silicon pillar 50 and an exposed surface of the silicon oxide film 52) is deepened by dry etching using the hardmask M2 which is patterned in this way (FIG. 8). By this etching process, a trench is formed in the active region 13, and the silicon pillar 14 having one sidewall substantially perpendicular to the main surface of the silicon substrate 11 and the dummy pillar 15B made of an insulator are formed by portions not deepened. The silicon pillar 14 and the dummy pillar 15B are also collectively called a composite pillar P in the following explanations. The insulation film 19 remaining on an upper part of the composite pillar P becomes a cap insulation film.

Figure 9:
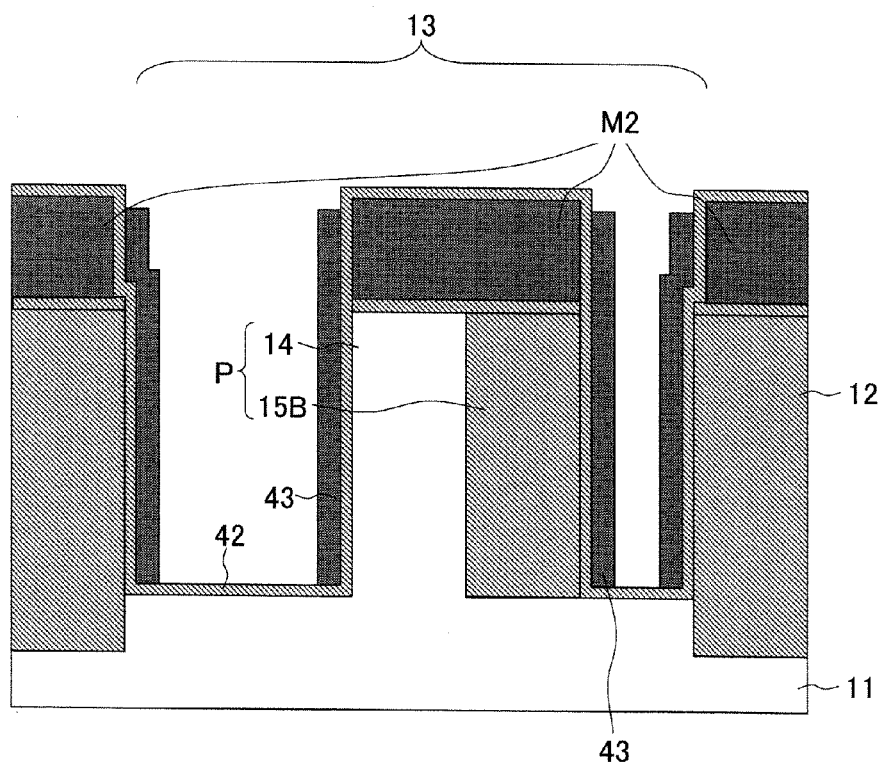

A sidewall dielectric film 43 is then formed on side surfaces of the composite pillar P (FIG. 9). The sidewall dielectric film 43 is formed by forming a silicon nitride film, after protecting the entire surface of the substrate 11 with a thermally oxidized film 42 with the hardmask M2 left, and by etching back this silicon nitride film. As a result, an outer circumference surface of the active region 13 (an inner circumference surface of the STI 12) and the side surfaces of the composite pillar P are covered with the sidewall dielectric film 43.

Figure 10:
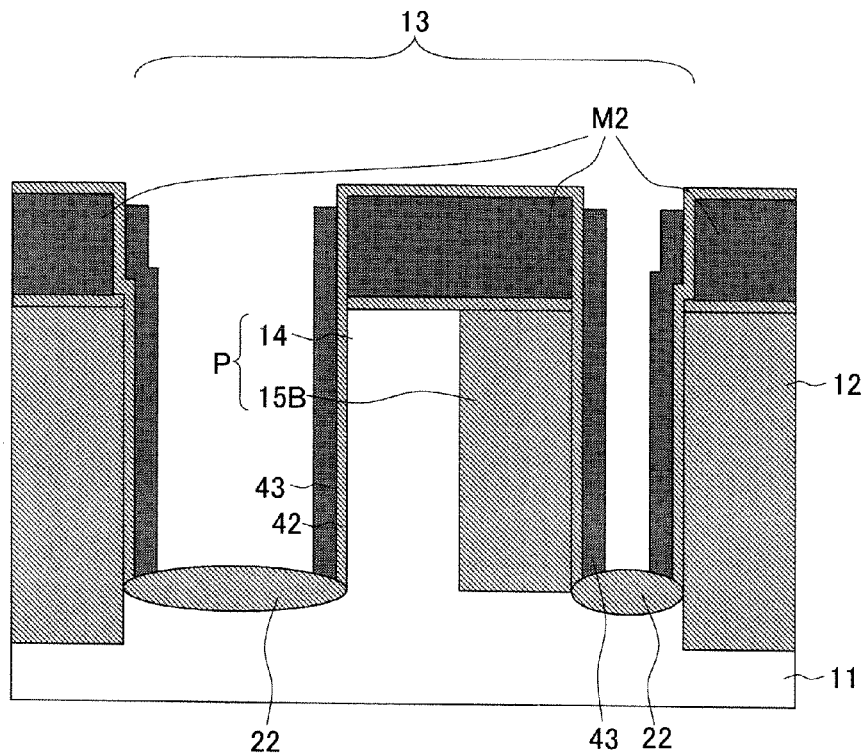

Next, a silicon oxide film 22 is then formed by thermal oxidation on the exposed surface of the active region 13 (that is, a bottom surface of the active region 13) (FIG. 10). In this case, upper surfaces and the side surfaces of the composite pillar P are covered with the hardmask M2 and the sidewall dielectric film 43, respectively, and therefore are not thermally oxidized. Although not particularly limited thereto, the film thickness of the silicon oxide film 22 is preferably about 30 nm.

Figure 11:
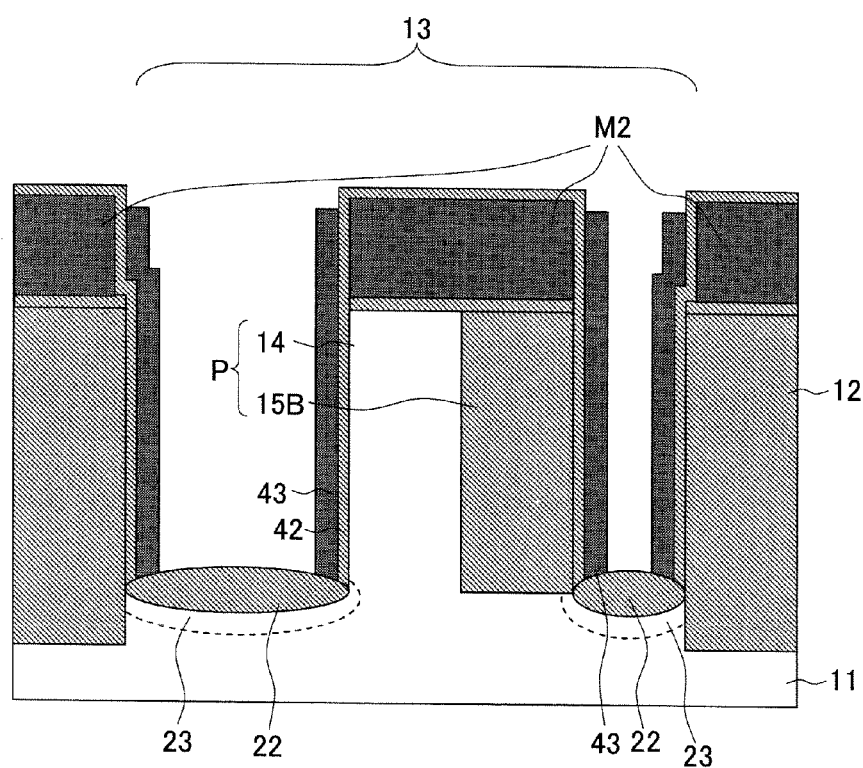

The second diffusion layer 23 is then formed at lower parts of the composite pillar P (FIG. 11). The second diffusion layer 23 is formed by ion implanting an impurity having a conductivity type opposite to that of an impurity in the silicon substrate 11 via the silicon oxide film 22 formed on the surface of the active region 13.

Figure 12:
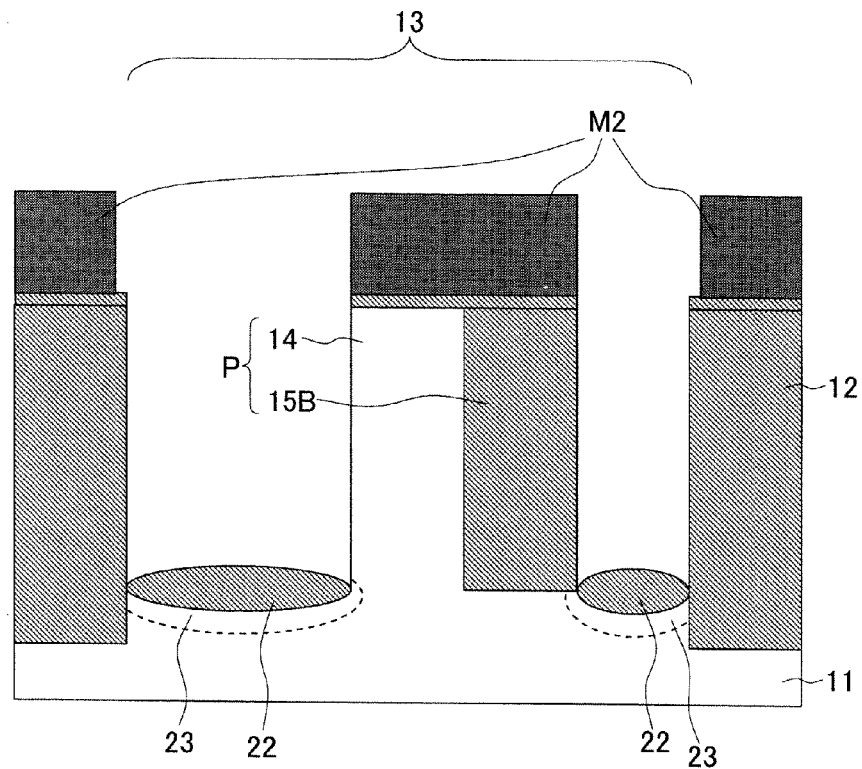

The sidewall dielectric film 43 and the thermally oxidized film 42 are then removed by wet etching (FIG. 12). As a result, the silicon oxide film 22 formed on the bottom surface of the active region 13, and the side surfaces of the composite pillar P are exposed. The upper surfaces of the composite pillar P remain covered with the hardmask M2.

Figure 13:
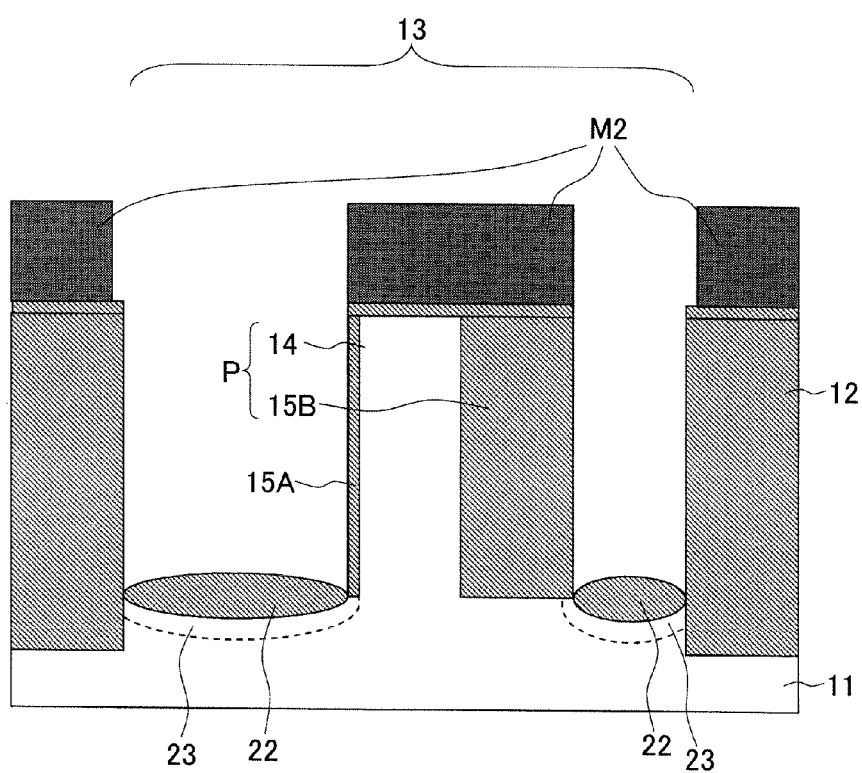

The gate dielectric film 15A is then formed on the side surface of the silicon pillar 14 (FIG. 13). The gate dielectric film 15A can be formed by thermal oxidation, and the film thickness of this film is preferably about 5 nm.

Figure 14:
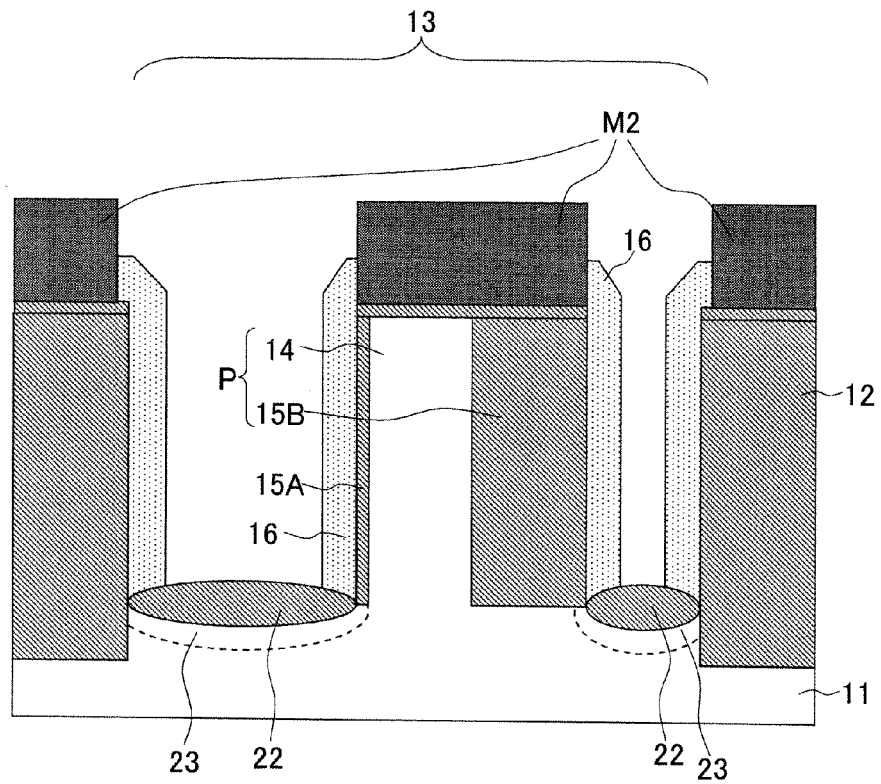

The gate electrode 16 made of a polycrystalline silicon film is formed next (FIG. 14). The gate electrode 16 is formed by forming a polycrystalline silicon film having a film thickness of about 30 nm on the entire surface of the substrate 11 by the CVD method, and thereafter by etching back the polycrystalline silicon film by anisotropic dry etching. As a result, the side surfaces of the composite pillar P are covered with the gate electrode 16. Although a polycrystalline silicon film remains on the side surface of the STI 12, this polycrystalline silicon film does not function as a gate electrode. For a material of the gate electrode 16, a metal material such as tungsten, for example, can be also used as well as a polycrystalline silicon film.

Figure 15:
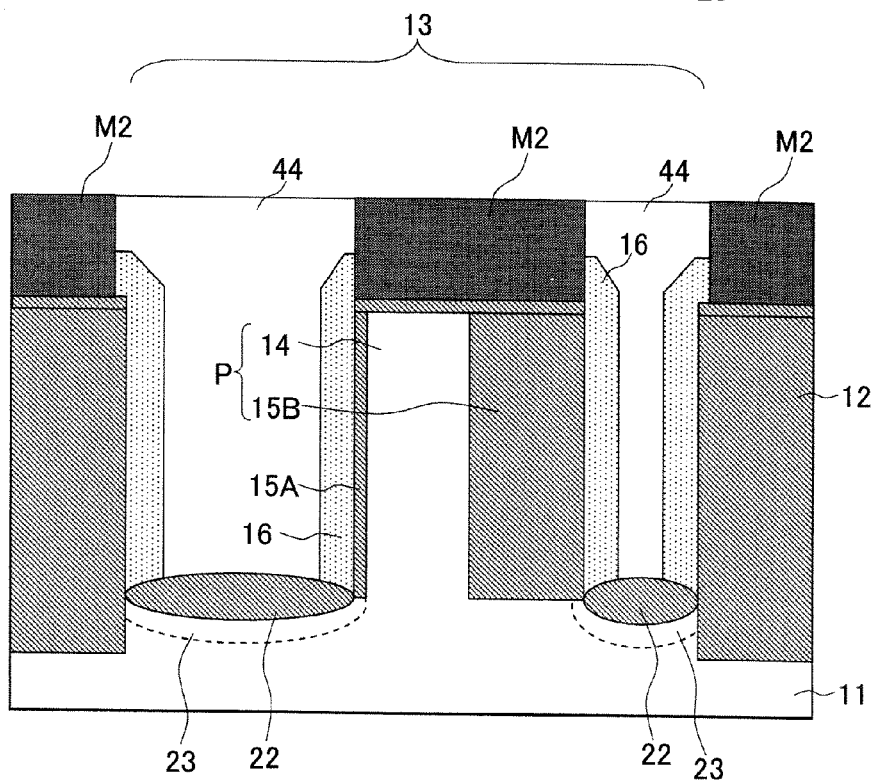

A silicon oxide film 44 (a first interlayer dielectric film) is then formed on the entire surface of the substrate 11 by an HDP (High Density Plasma) method, and the surface is planarized by polishing by CMP (FIG. 15). In this case, by arranging such that the hardmask M2 functions as a stopper, the film thickness of the silicon oxide film 44 can be securely controlled. As a result, the active region 13 is embedded with the silicon oxide film 44.

Figure 16:
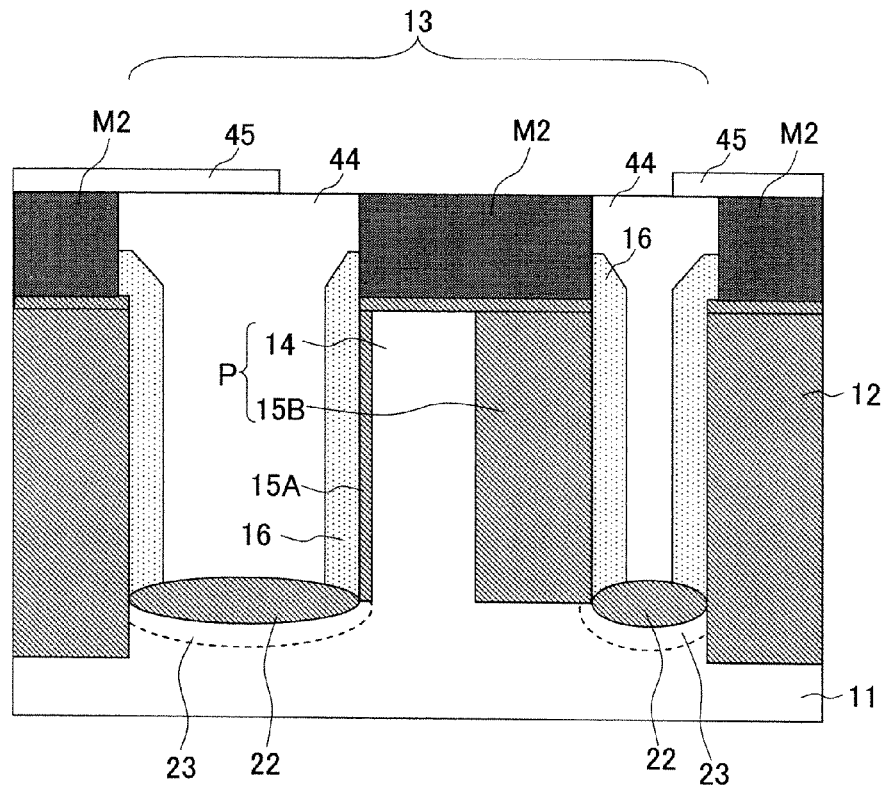
Figure 17:
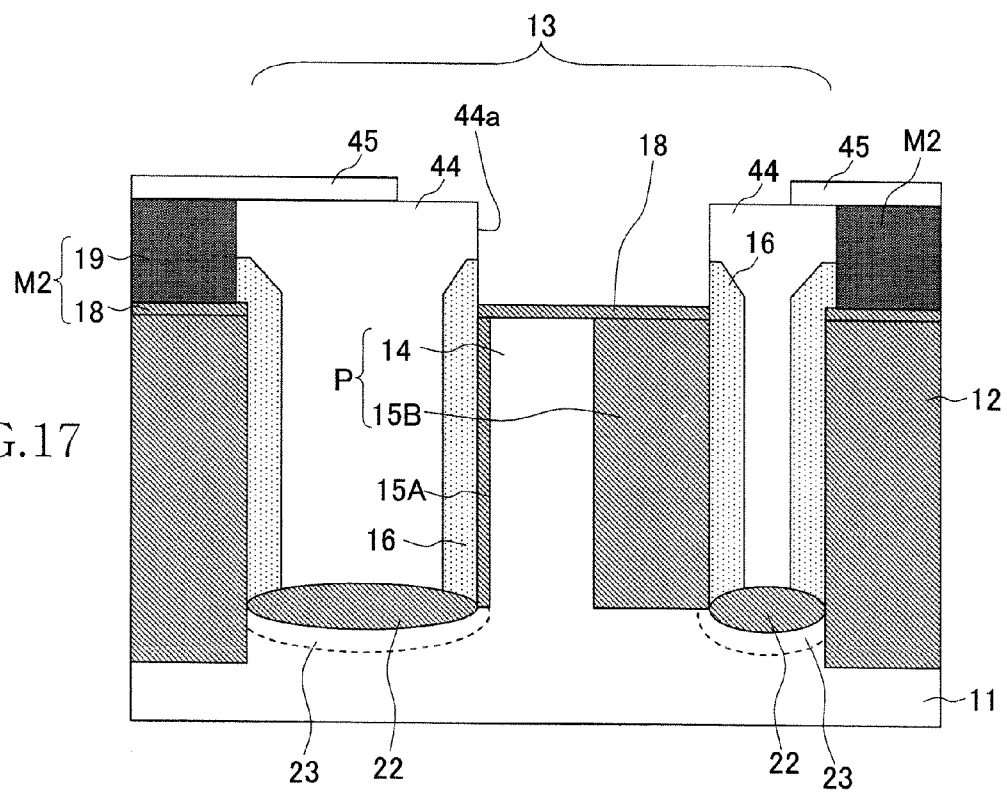

A mask oxide film 45 made of a silicon oxide film is then formed on the entire surface of the substrate 11. The mask oxide film 45 can be formed by the CVD method. The film thickness of the mask oxide film 45 is preferably about 5 nm. The mask oxide film 45 is patterned such that the hardmask M2 provided above the composite pillar P is exposed and that the hardmask M2 provided above the STI 12 is not exposed (FIG. 16). Thereafter, the silicon nitride film 19 within the hardmask M2 exposed is removed by dry etching or by wet etching. As a result, a through hole 44a having the substrate protection film 18 as a bottom is formed above the composite pillar P (FIG. 17).

Figure 18:
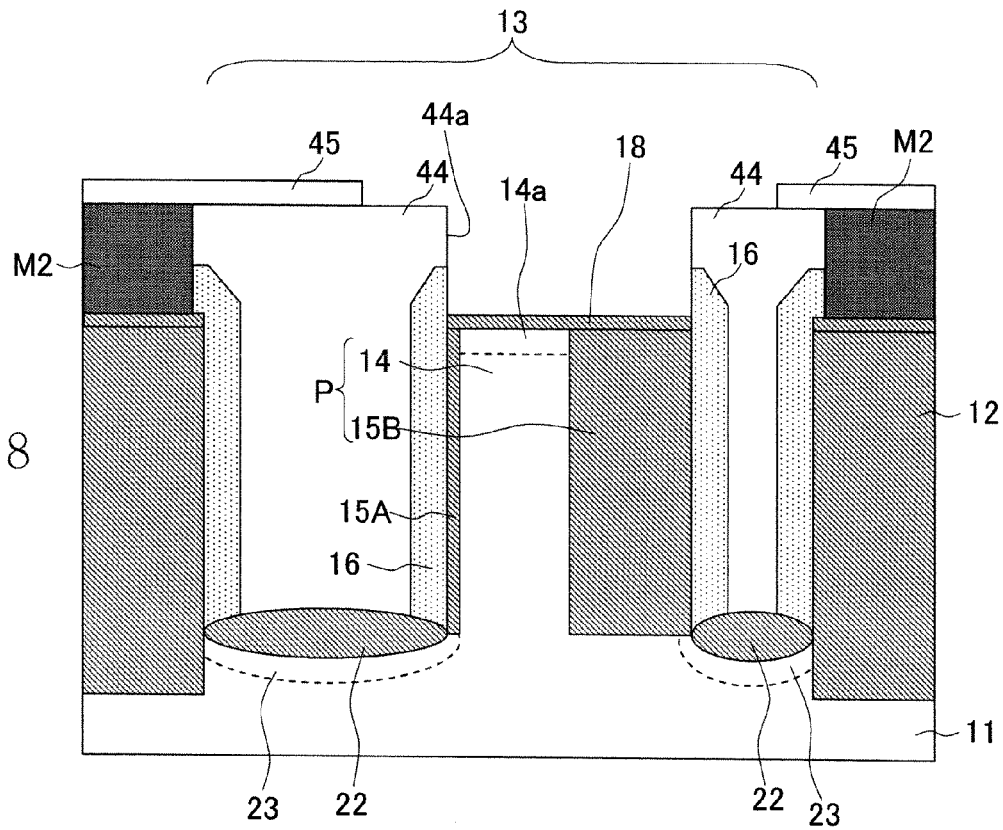

An LDD (Lightly doped drain) region 14a is then formed at an upper part of the silicon pillar 14 (FIG. 18). The LDD region 14a is formed by ion implanting in a small thickness an impurity of low concentration having a conductivity type opposite to that of an impurity in the silicon substrate 11 via the substrate protection film 18 provided in contact with an upper surface of the silicon pillar 14.

Figure 19:
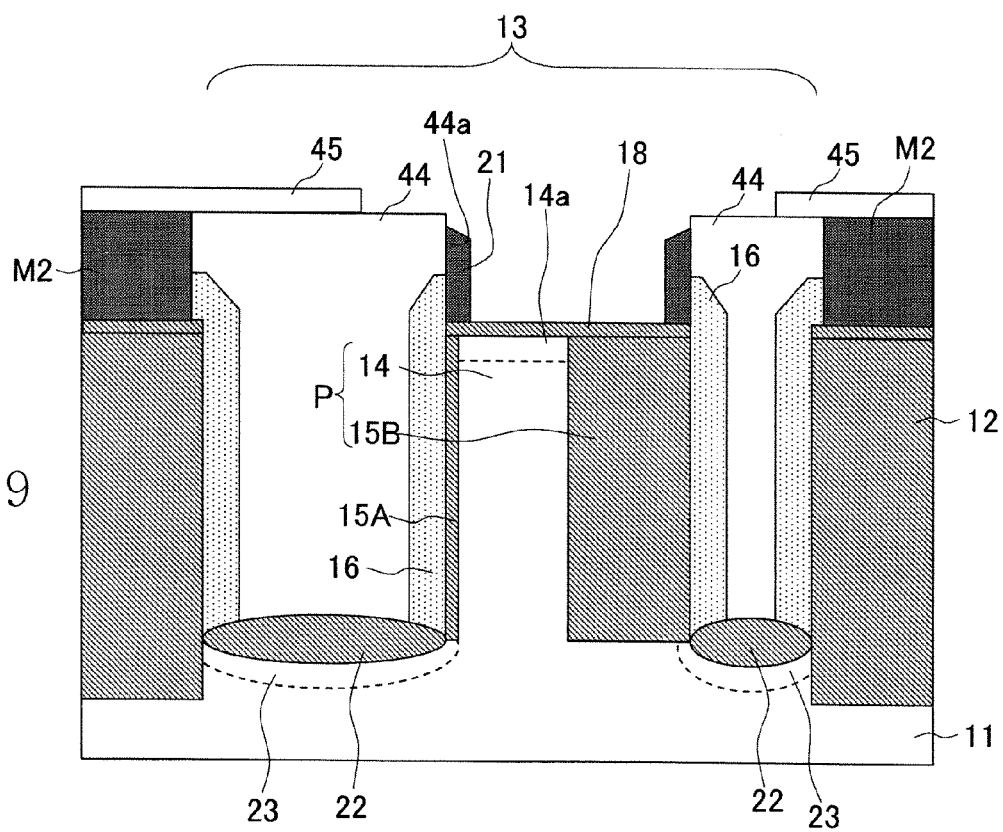
Figure 20:
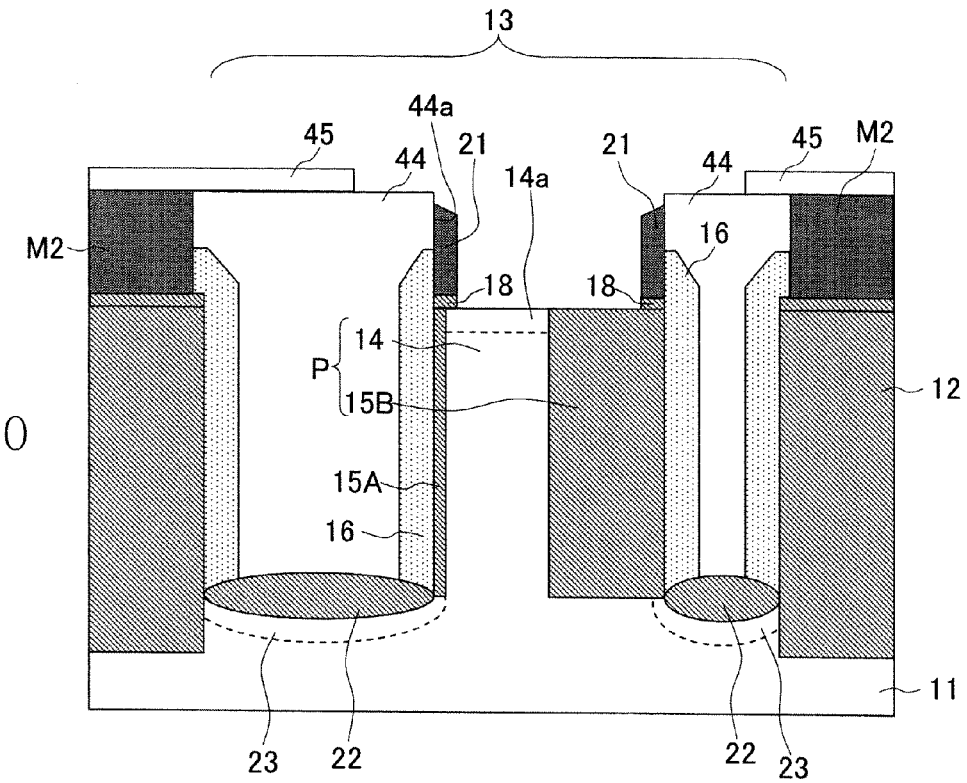

A sidewall dielectric film 21 is then formed on an internal wall surface of the through hole 44a (FIG. 19). The sidewall dielectric film 21 is formed by forming a silicon nitride film on the entire surface of the substrate 11, and thereafter, by etching back this silicon nitride film. Although not particularly limited thereto, preferably, the film thickness of the sidewall dielectric film 21 is set at about 10 nm. Because, in this way, the sidewall dielectric film 21 is formed on the internal wall surface of the through hole 44a and also because the through hole 44a is formed by removing the insulation film 19 constituting the hardmask M2 used to form the composite pillar P, an outer circumference part of the sidewall dielectric film 21 in a cylindrical shape matches an outer circumference part of the composite pillar P as viewed planarly.

Figure 21:
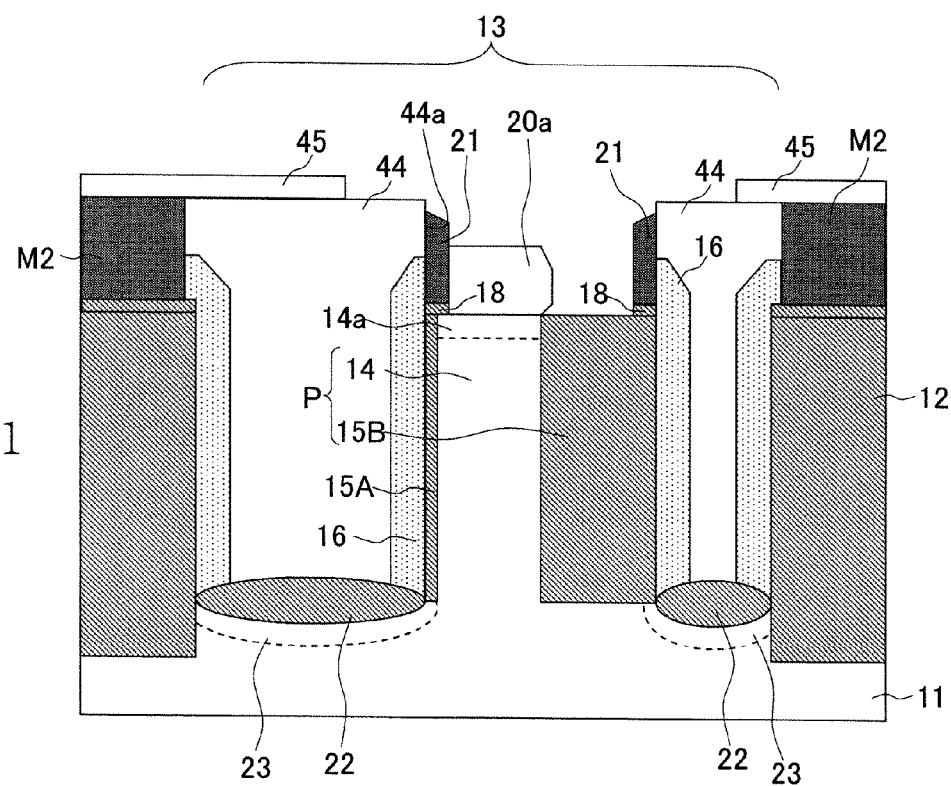
Figure 22:
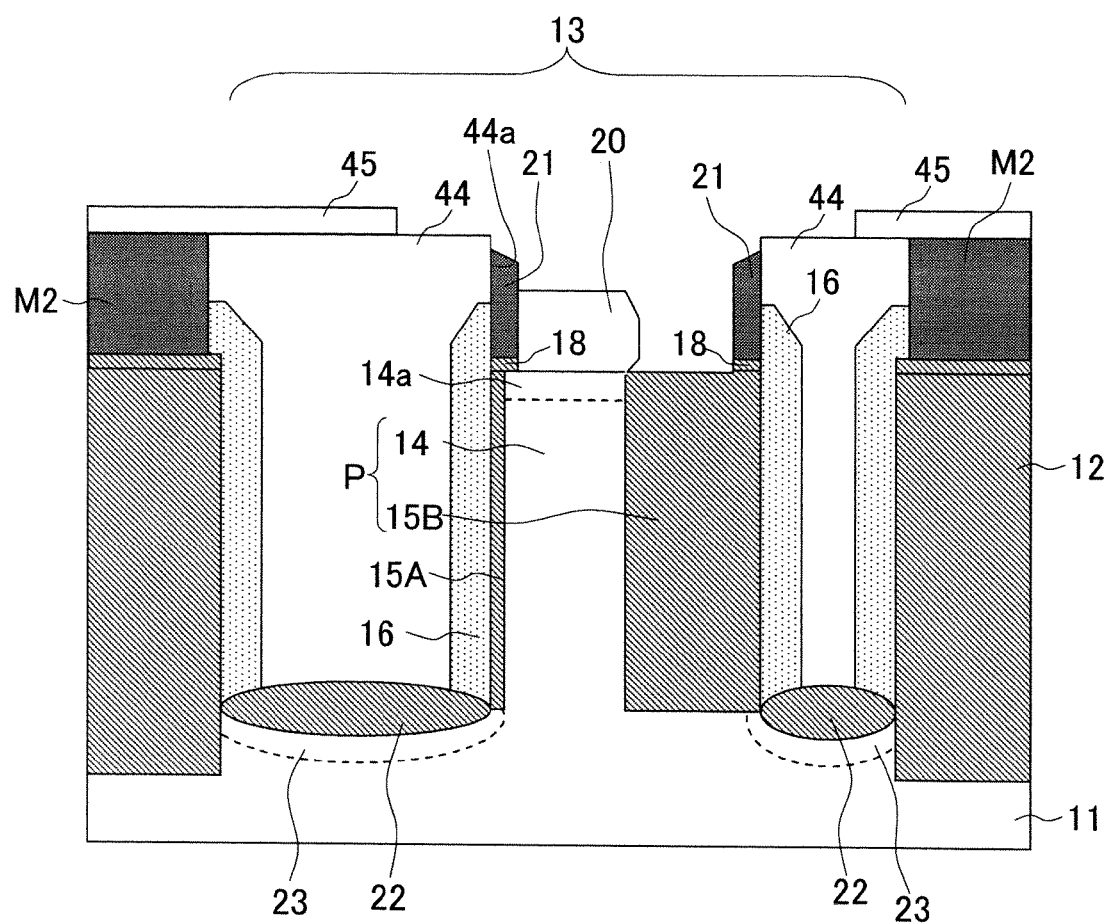

The substrate protection film 18 on a bottom surface of the through hole 44a is then removed by rare hydrofluoric acid (FIG. 20), and thereafter silicon is selectively epitaxially grown within the through hole 44a (FIG. 21). An impurity having a conductivity type opposite to that of an impurity in the silicon substrate 11 is ion implanted into a silicon epitaxial layer 20a formed, thereby forming the first diffusion layer 20 (FIG. 22). By employing this manufacturing method, the first diffusion layer 20 is formed in self-alignment only above the silicon pillar 14 within the through hole 44a, and is not formed above the dummy pillar 15B.

Figure 23:
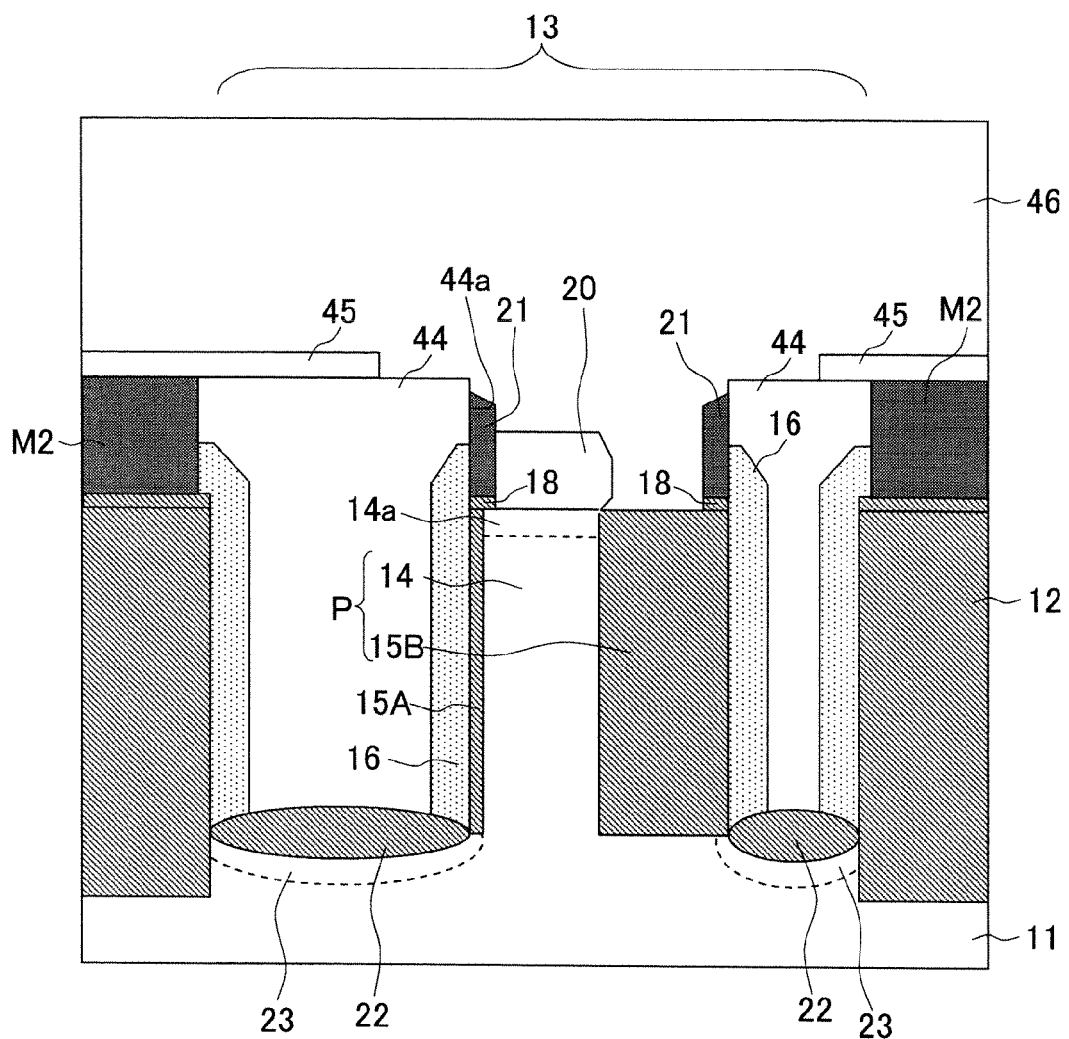
Figure 24:
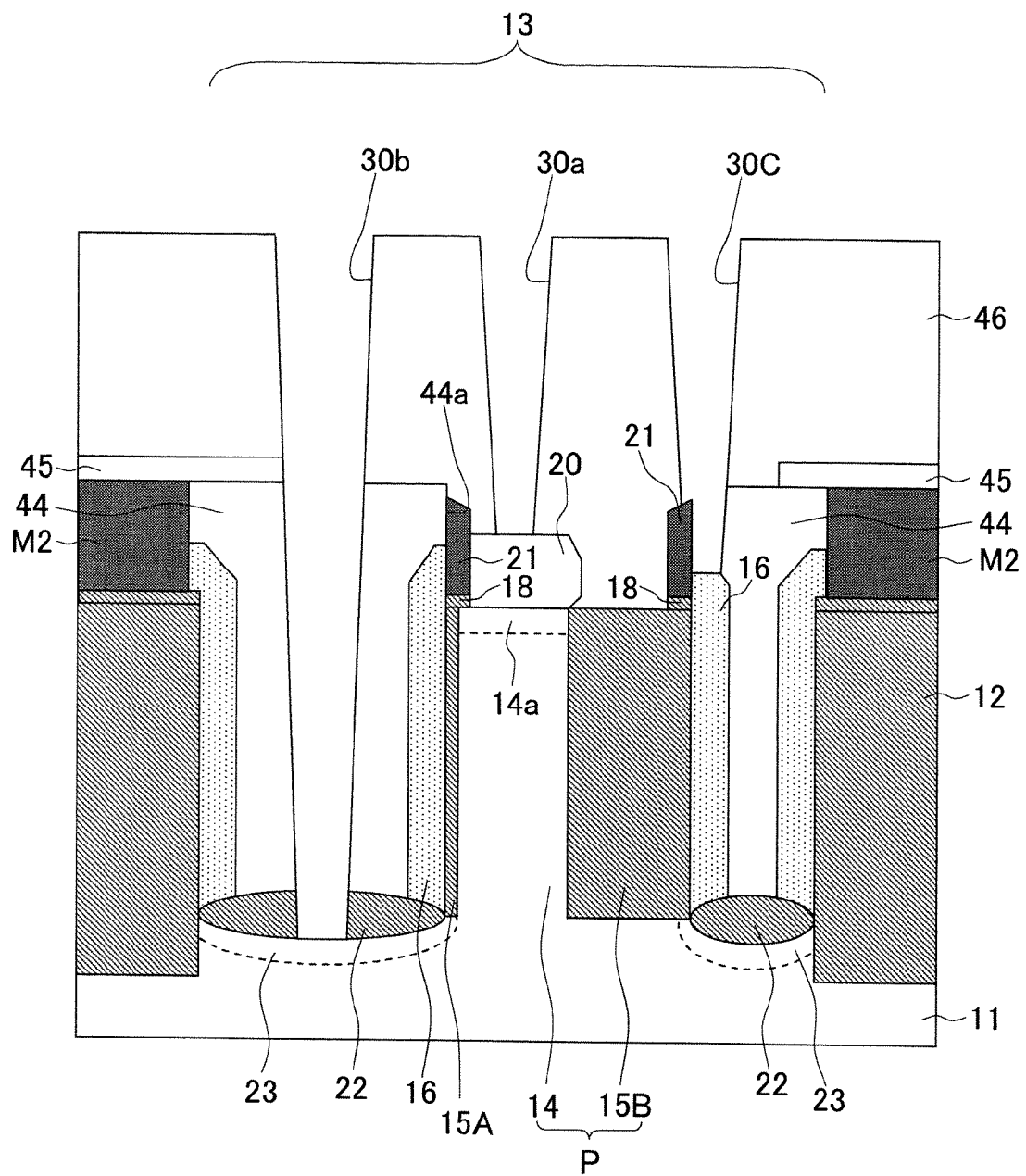

A silicon oxide film is then deposited on the entire surface of the substrate 11, and the surface is planarized by CMP, thereby forming an interlayer dielectric film 46 (a second interlayer dielectric film) (FIG. 23). First to third through holes 30a to 30c (contact holes) are formed in the interlayer dielectric film 46 by patterning (FIG. 24). The first through hole 30a is formed immediately above the silicon pillar 14, and penetrates through the interlayer dielectric film 46 into the first diffusion layer 20. The second through hole 30b is formed in a space region within the active region provided adjacently to the composite pillar P, and penetrates through the interlayer dielectric films 44 to 46 into the second diffusion layer 23. The third through hole 30c is formed at a position having the gate electrode 16 exposed immediately above a portion at an opposite side of the silicon pillar 14 sandwiching the dummy pillar 15B out of the side surface of the dummy pillar 15B, and penetrates through the interlayer dielectric films 44 and 46 into the gate electrode 16.

Figure 25:
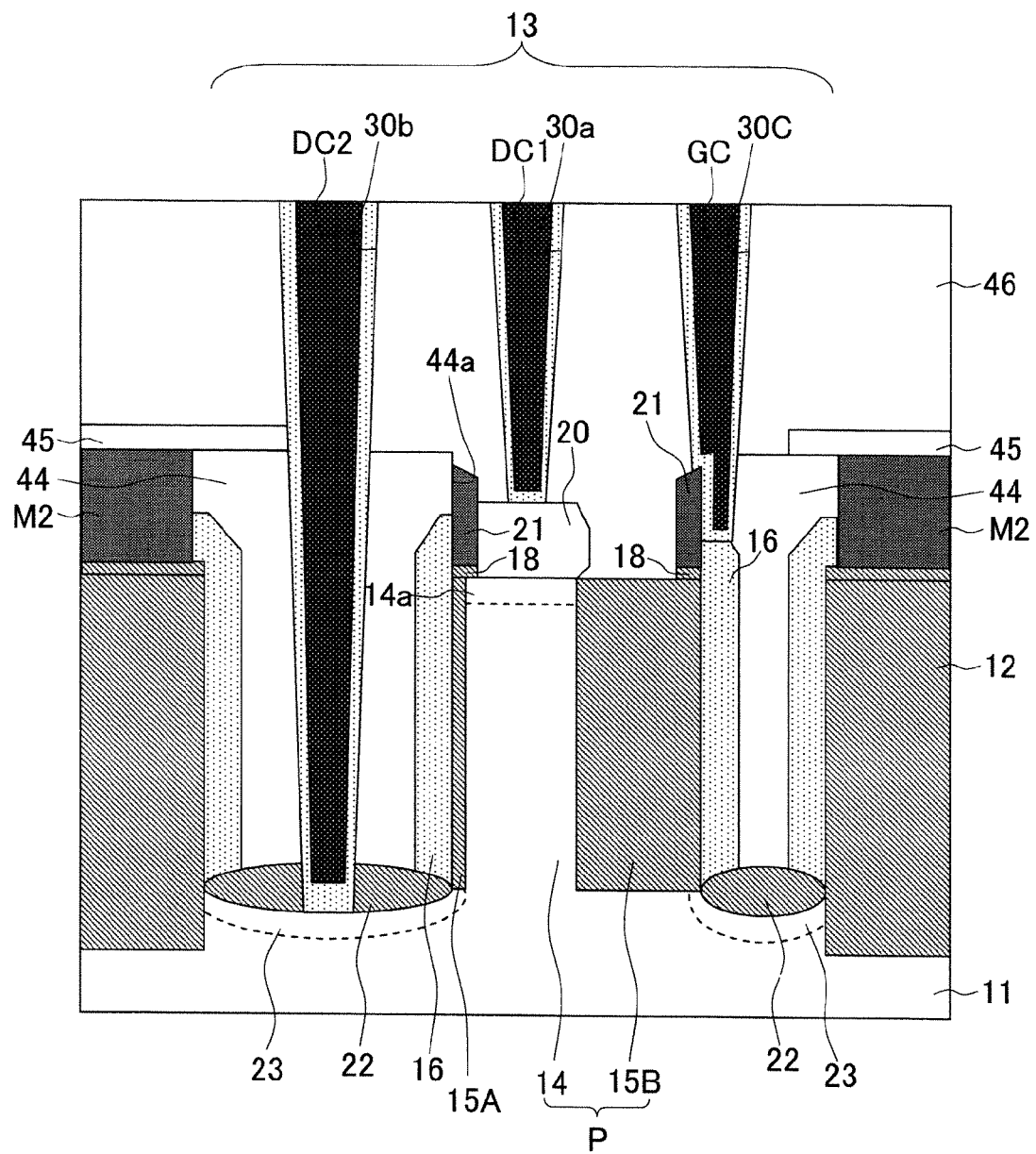

Titanium nitride and tungsten are then embedded in this order into the first to third through holes 30a to 30c, thereby forming the first diffusion-layer contact plug DC1, the second diffusion-layer contact plug DC2, and the gate contact plug GC made of a lamination film of titanium nitride and tungsten, respectively (FIG. 25). Thereafter, the wiring patterns 60 to 62 shown in FIG. 1 are formed, thereby completing the semiconductor device 10.

It is apparent that the present invention is not limited to the above embodiments, but may be modified and changed without departing from the scope and spirit of the invention.

For example, although one dummy pillar is provided for one silicon pillar 14 of the above embodiment, one dummy pillar can be also provided for plural silicon pillars 14.

Figure 26A:
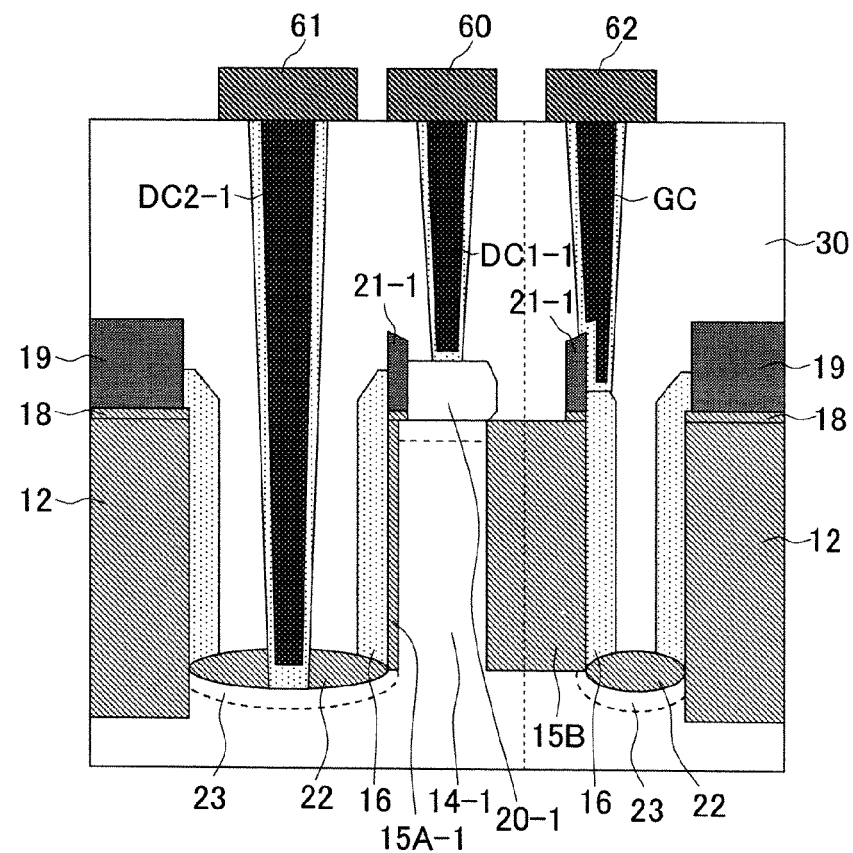
FIG. 26A is a schematic cross-sectional view showing a configuration of a semiconductor device according to a modification of the embodiment of the present invention along a line B-B' in FIG. 26B.
Figure 26B:
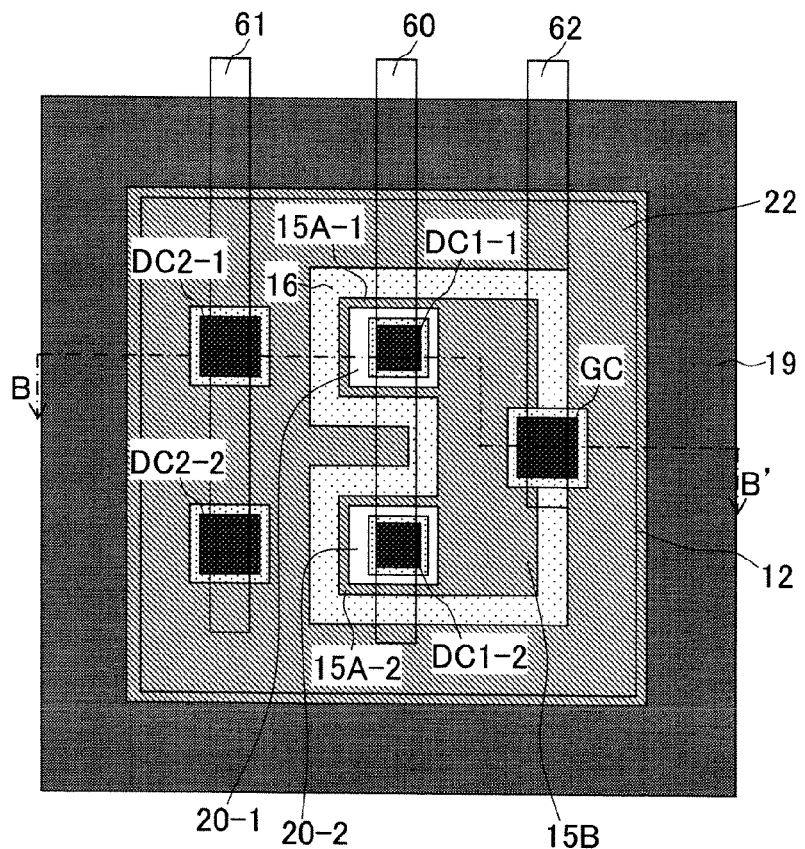
FIG. 26B is a schematic plan view showing a configuration of the semiconductor device according to the modification of the embodiment of the present invention.

FIGS. 26A and 26B show an example of a configuration of the semiconductor device 10 in which one dummy pillar is provided for two silicon pillars 14; where FIG. 26A is a schematic cross-sectional view and FIG. 26B is a schematic plan view. FIG. 26A is a cross-sectional view along a line B-B' in FIG. 26A.

As shown in FIGS. 26A and 26B, the semiconductor device 10 according to a modification of the above embodiment has two silicon pillars 14 in a quadratic prism shape including a silicon pillar 14-1 shown. Out of four side surfaces of each of the silicon pillars 14, three side surfaces excluding a side surface at the right side in these drawings are covered with the gate dielectric films 15A-1 and 15A-2, and the side surface at the right side in the drawings is covered with the common dummy pillar 15B.

The two silicon pillars 14 are connected to the gate electrode 16 common to these silicon pillars via the gate dielectric films 15A-1 and 15A-2, respectively. The gate electrode 16 is connected to the wiring pattern 62 via the gate contact plug GC. Diffusion layers 20-1 and 20-2 are formed on upper parts of the two silicon pillars 14, respectively. The diffusion layers 20-1 and 20-2 are also connected to the wiring pattern 60 common via the first diffusion-layer contact plugs DC1-1 and DC1-2, respectively. The second diffusion layer 23 is formed in common at lower parts of the two silicon pillars 14, and is connected to the wiring pattern 61 via the two second diffusion-layer contact plugs DC2-1 and DC2-2.

Based on the above configuration, in the semiconductor device 10 according to the present modification, a channel size of a transistor is two times of that of the semiconductor device 10 shown in FIGS. 1A and 1B and the like, thereby making it possible to pass a larger current. Although FIGS. 26A and 26B show an example of providing one dummy pillar for the two silicon pillars 14, the number of the silicon pillar 14 can be suitably changed according to an amount of the current required for a circuit.

When one dummy pillar is provided for plural silicon pillars 14, a circuit of a high withstanding voltage can be also configured by connecting in series transistors configured by the silicon pillar 14.

Figure 27A:
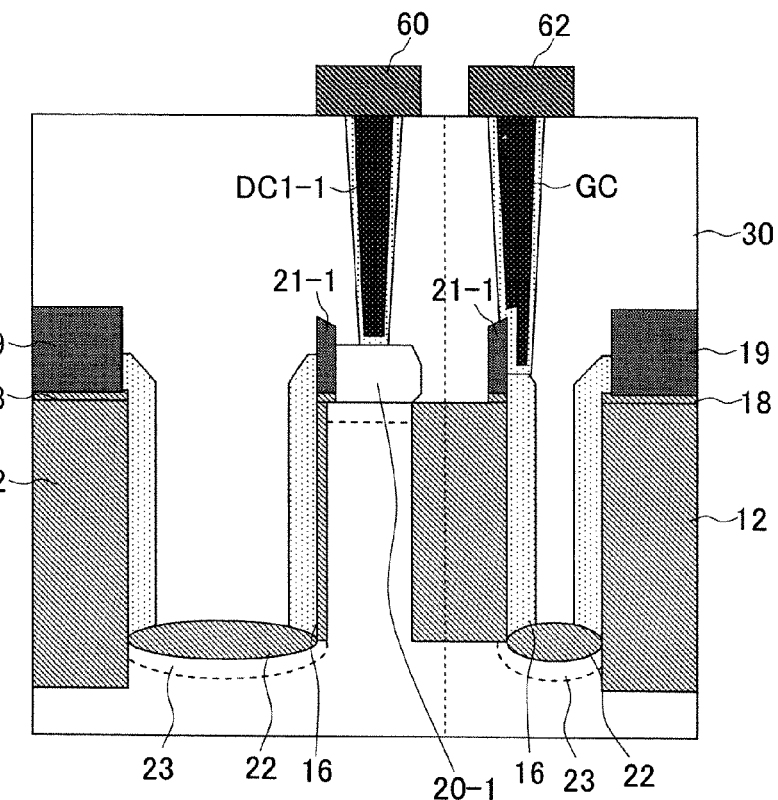
FIG. 27A is a schematic cross-sectional view showing a configuration of a semiconductor device according to a modification of the embodiment of the present invention along a line C-C' in FIG. 27B.
Figure 27B:
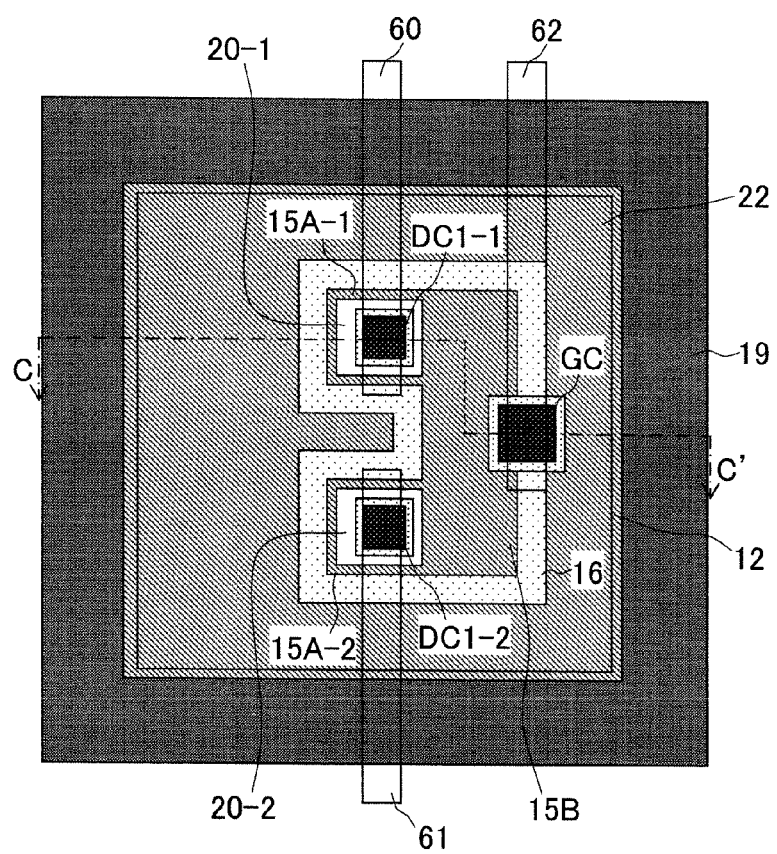
FIG. 27B is a schematic plan view showing a configuration of the semiconductor device according to the modification of the embodiment of the present invention.

FIGS. 27A and 27B show a configuration of the semiconductor device 10 in an example that one dummy pillar is provided for two silicon pillars 14, and transistors configured by the two silicon pillars 14 are connected in series. FIG. 27A is a schematic cross-sectional view, and FIG. 27B is a schematic plan view. FIG. 27A is the cross-sectional view along a line C-C' in FIG. 27B.

As shown in FIGS. 27A and 27B, the semiconductor device 10 according to the present modification is different from the semiconductor device shown in FIGS. 26A and 26B in that the second diffusion-layer contact plug is not provided, and that the first diffusion-layer contact plugs DC1-1 and DC1-2 are connected to the wiring patterns 60 and 61 mutually different, respectively, instead of the common wiring pattern 60. Because, based on this configuration, transistors each configured by two silicon pillars are connected in series via the second diffusion layer 23 in the semiconductor device 10 according to the present modification, a circuit of a higher withstanding voltage is achieved.

Figure 28:
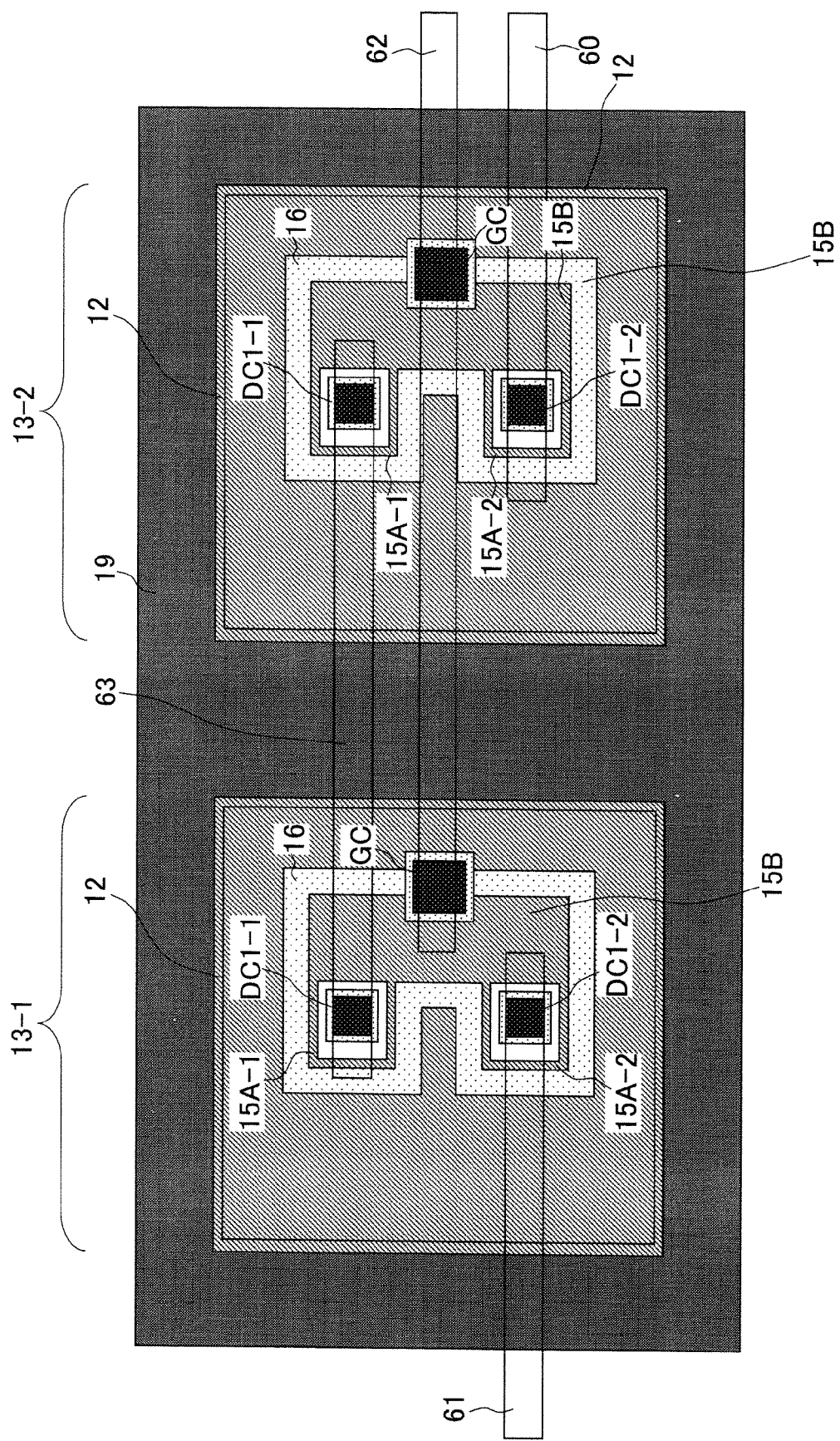
FIG. 28 is a schematic plan view showing a configuration of the semiconductor device according to the modification of the embodiment of the present invention.

A circuit of a much higher withstanding voltage can be also obtained by mutually connecting in series transistors formed in different active regions. FIG. 28 shows a schematic plan view of the semiconductor device 10 according to this example. In the example shown in FIG. 28, transistors shown in FIGS. 27A and 27B are formed in two active regions 13-1 and 13-2, respectively. Both of the first diffusion-layer contact plugs DC1-1 are connected to each other by a wiring pattern 63. The wiring pattern 60 is connected to one first diffusion-layer contact plug DC1-2, and the wiring pattern 61 is connected to the other first diffusion-layer contact plug DC1-2. The wiring pattern 62 is connected in common to both of the gate contact plugs GC. Based on this configuration, a circuit of a higher withstanding voltage is achieved.

Figure 29:
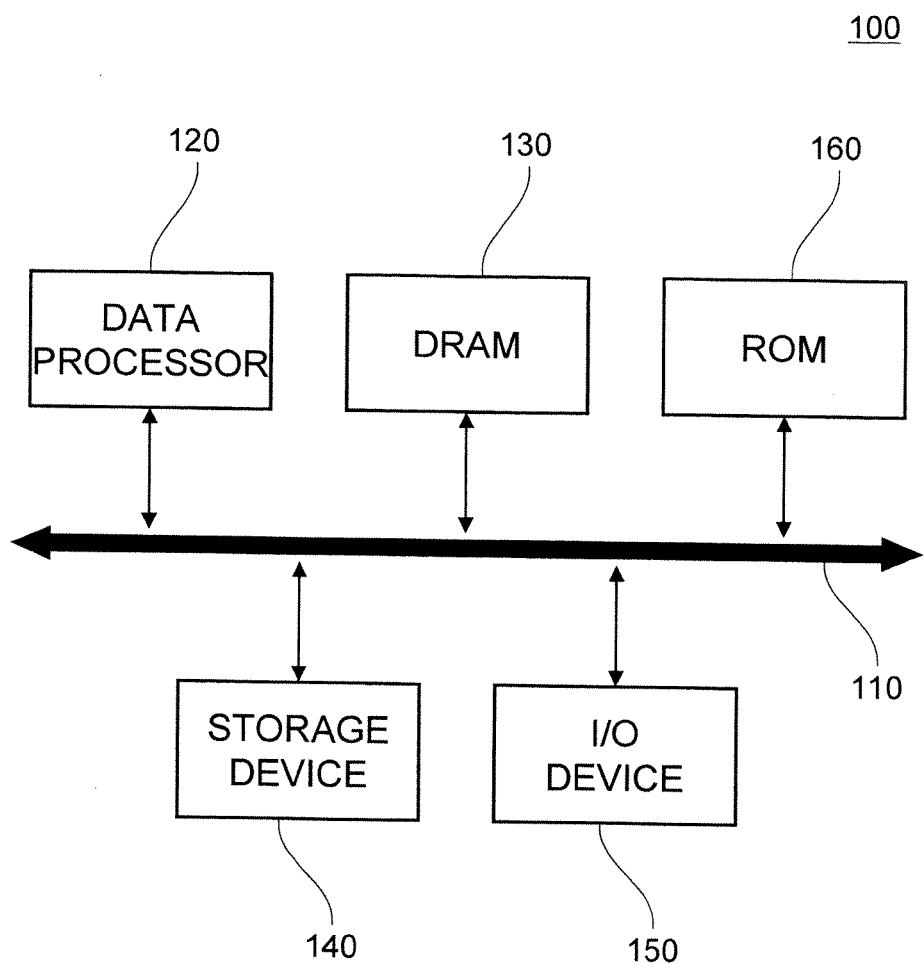
FIG. 29 is a block diagram of a configuration of a data processing system using the semiconductor device.

FIG. 29 is a block diagram of a configuration of a data processing system 100 using the semiconductor device according to the preferred embodiment of the present invention. FIG. 29 shows the case in which the semiconductor device is DRAM.

The data processing system 100 shown in FIG. 29 has a configuration including a data processor 120 and the semiconductor device (DRAM) 130 according to the embodiment connected to each other via a system bus 110. While a microprocessor (MPU) and a digital signal processor (DSP) are mentioned as the data processor 120, it is not limited thereto. Although the data processor 120 and DRAM 130 are connected to each other via the system bus 110 in FIG. 29 for simplicity, the data processor 120 and DRAM 130 can be connected to each other via a local bus without using the system bus 110.

Although FIG. 29 shows only one set of the system bus 110 for simplicity, the system bus 110 can be provided in plural, that is, in series or in parallel via a connector or the like. Although a storage device 140, an I/O device 150, and a ROM (Read Only Memory) 160 are connected to the system bus 110 in the data processing system 100 shown in FIG. 29, these are not necessarily essential constituent elements.

A hard disk drive, an optical disk drive, and a flash memory are mentioned as the storage device 140. A display device such as a liquid crystal display and an input device such as a keyboard and a mouse are mentioned as the I/O device 150. Only either an input device or an output device can be sufficient for the I/O device 150. Further, although only each one of the constituent elements is shown in FIG. 29 for simplicity, the number is not limited to one, and two or more constituent elements can be also provided.

In addition, while not specifically claimed in the claim section, the applicant reserves the right to include in the claim section of the application at any appropriate time the following methods or data processing system:

A1. A manufacturing method of a semiconductor device, comprising:
 forming a trench by etching a part of a main surface of a silicon substrate;
 filling the trench with an insulation film;
 etching the main surface of the silicon substrate and the insulation film by using a mask crossing a boundary between the silicon substrate and the insulation film to form a composite pillar made of a silicon pillar and an insulator pillar;
 forming a gate dielectric film on a side surface of the silicon pillar;
 forming a gate electrode by forming a film of a conductive material on the main surface of the silicon substrate, and by etching back the film formed;
 forming a first interlayer dielectric film that covers side surfaces of the composite pillar and the gate electrode;
 removing the mask to expose an upper surface of the composite pillar;
 forming a first diffusion layer by selectively epitaxially growing silicon within a through hole formed by removing the mask film;
 forming a second interlayer dielectric film that covers the first interlayer dielectric film and the composite pillar;
 forming first and second contact holes for exposing the gate electrode and the first diffusion layer, respectively on the second interlayer dielectric film; and
 forming first and second contact plugs in the first and second contact holes, respectively.

A2. The manufacturing method of a semiconductor device according to A1, wherein the first contact hole is formed at a position immediately above a portion at an opposite side of the silicon pillar sandwiching the insulator pillar out of a side surface of the insulator pillar.

A3. The manufacturing method of a semiconductor device according to A1, further comprising forming a sidewall dielectric film within the through hole before forming the first diffusion layer.

A4. The manufacturing method of a semiconductor device according to A1, further comprising forming a second diffusion layer at a lower part of the silicon pillar, wherein
 when forming the first and second contact holes, a third contact hole for exposing the second diffusion layer is further formed, and
 when forming the first and second contact plugs, a third contact plug is also formed within the third contact hole.

B1. A data processing system comprising a semiconductor device, a data processor, a ROM, a storage device, and an I/O device, wherein the semiconductor device, the data processor, the ROM, the storage device, and the I/O device are connected to each other by a system bus, the semiconductor device comprising:
 a semiconductor substrate having a main surface;
 a silicon pillar having first and second side surfaces that are substantially perpendicular to the main surface of the semiconductor substrate;
 a gate dielectric film that covers the first side surface of the silicon pillar;
 an insulator pillar that covers the second side surface of the silicon pillar;
 a gate electrode having a first portion that covers the first side surface of the silicon pillar via the gate dielectric film and a second portion that covers the insulator pillar;
 an interlayer dielectric film provided above the silicon pillar, the gate dielectric film, the insulator pillar, and the gate electrode; and
 a gate contact plug that is embedded in a first contact hole provided in the interlayer dielectric film and is in contact with the second portion of the gate electrode,
 wherein a film thickness of the insulator pillar in a direction parallel to the main surface of the semiconductor substrate is thicker than a film thickness of the gate dielectric film in the direction.

What is claimed is:

1. A semiconductor device comprising:
 an active region defined by an isolation region;
 an insulating pillar protruding from the active region;
 a first semiconductor pillar protruding from the active region and including a first side surface portion that is contact with a part of the insulating pillar, the first semiconductor pillar including a second side surface portion that is apart from the insulating pillar;
 a second semiconductor pillar protruding from the active region and including a third side surface portion that is contact with another part of the insulating pillar, the second semiconductor pillar including a fourth side surface portion that is apart from the insulating pillar;
 a gate insulating film covering at least the second side surface portion of the first semiconductor pillar and the fourth side surface portion of the second semiconductor pillar;
 a gate electrode formed on the gate insulation film to cover the second side surface portion of the first semiconductor pillar and the fourth side surface portion of the second semiconductor pillar;
 first and second diffusion regions for a first transistor that includes the second side surface portion of the first semiconductor pillar as a channel region; and
 third and fourth diffusion regions for a second transistor that includes the fourth side surface portion of the second semiconductor pillar as a channel region.

2. The device as claimed in claim 1, wherein the first and third diffusion regions are connected to each other and the second and fourth diffusions are connected to each other so that the first and second transistors are connected in parallel to each other.

3. The device as claimed in claim 1, wherein the second and fourth diffusions are connected to each other so that the first and second transistors are connected in series between the first and third diffusion regions.

4. The device as claimed in claim 1, further comprising:
 an additional active region isolated from the active region by the isolation region;
 an additional insulating pillar protruding from the additional active region;
 a third semiconductor pillar protruding from the additional active region and including a fifth side surface portion that is contact with a part of the additional insulating pillar, the third semiconductor pillar including a sixth side surface portion that is apart from the additional insulating pillar;
 a fourth semiconductor pillar protruding from the additional active region and including a seventh side surface portion that is contact with another part of the additional insulating pillar, the fourth semiconductor pillar including an eighth side surface portion that is apart from the additional insulating pillar;
 an additional gate insulating film covering at least the sixth side surface portion of the third semiconductor pillar and the eighth side surface portion of the fourth semiconductor pillar;
 an additional gate electrode formed on the additional gate insulation film to cover sixth side surface portion of the third semiconductor pillar and the eighth side surface portion of the fourth semiconductor pillar;

fifth and sixth diffusion regions for a third transistor that includes the sixth side surface portion of the third semiconductor pillar as a channel region; and seventh and eighth fourth diffusion regions for a fourth transistor that includes the eighth side surface portion of the fourth semiconductor pillar as a channel region.

5. The device as clamed in claim 4, wherein the second and fourth diffusion regions are connected to each other and the sixth and eighth diffusion regions are connected to each other so that the first, second, third and fourth transistors are connected in series between the first and seventh diffusion regions.

* * * * *